US012512292B2

(12) United States Patent
Mustapha et al.

(10) Patent No.: US 12,512,292 B2
(45) Date of Patent: Dec. 30, 2025

(54) COMPACT 2D SCANNER MAGNET WITH DOUBLE-HELIX COILS

(71) Applicant: UCHICAGO ARGONNE, LLC, Chicago, IL (US)

(72) Inventors: Brahim Mustapha, Naperville, IL (US); Jerry A. Nolen, Jr., Chicago, IL (US); Rainer Meinke, Melbourne, FL (US)

(73) Assignee: UCHICAGO ARGONNE, LLC, Chicago, IL (US)

( * ) Notice: Subject to any disclaimer, the term of this patent is extended or adjusted under 35 U.S.C. 154(b) by 324 days.

(21) Appl. No.: 18/101,672

(22) Filed: Jan. 26, 2023

(65) Prior Publication Data

US 2023/0238206 A1 Jul. 27, 2023

Related U.S. Application Data

(60) Provisional application No. 63/303,339, filed on Jan. 26, 2022.

(51) Int. Cl.

| | |
|---|---|
| ***H01J 37/14*** | (2006.01) |
| ***H01J 37/08*** | (2006.01) |
| ***H01J 37/141*** | (2006.01) |
| ***H01J 37/147*** | (2006.01) |

(52) U.S. Cl.

CPC .......... *H01J 37/1475* (2013.01); *H01J 37/08* (2013.01); *H01J 37/141* (2013.01)

(58) Field of Classification Search

CPC ....... H01J 37/1475; H01J 37/08; H01J 37/141
See application file for complete search history.

(56) References Cited

U.S. PATENT DOCUMENTS 4,878,866 A * 11/1989 Mori ........................ H01J 1/148 445/36
6,921,042 B1 7/2005 Goodzeit et al.
7,889,042 B2 2/2011 Meinke
7,990,247 B2 8/2011 Meinke
8,040,012 B2 10/2011 Meinke et al.
(Continued)

OTHER PUBLICATIONS

Goodzeit et al., "Combined Function Magnets Using Double Helix Coils", Proceedings of PAC07, MOPA8055 (Year: 2007).*
(Continued)

*Primary Examiner* — Nicole M Ippolito
(74) *Attorney, Agent, or Firm* — MARSHALL, GERSTEIN & BORUN LLP

(57) ABSTRACT

A compact two-dimensional (2D) scanning magnet for scanning ion beams is provided. The compact 2D scanning magnet may include an outer double-helix coil and an inner double-helix coil that is disposed within the outer double-helix coil and is rotated about an axis relative to the outer double-helix coil. The outer double-helix coil may include a first outer coil configured to receive an input electrical current through the first outer coil in a first direction, and a second outer coil configured to receive the input electrical current through the second outer coil in a second direction. The inner double-helix coil may include a first inner coil configured to receive a second input electrical current through the first inner coil in the first direction, and a second inner coil configured to receive the second input electrical current through the second inner coil in the second direction.

20 Claims, 21 Drawing Sheets

(56) References Cited

U.S. PATENT DOCUMENTS

| | | | | |
|---|---|---|---|---|
| 8,424,193 | B2 | 4/2013 | Meinke | |
| 9,786,421 | B2 | 10/2017 | Meinke et al. | |
| 9,831,021 | B2 | 11/2017 | Meinke et al. | |
| 10,453,597 | B2 | 10/2019 | Meinke et al. | |
| 2012/0313003 | A1 * | 12/2012 | Trbojevic ............. | A61N 5/1081 250/396 ML |
| 2016/0030769 | A1 | 2/2016 | Cameron et al. | |

OTHER PUBLICATIONS

Goodzeit et al. (Combined Function Magnets Using Double Helix Coils, Proceedings of PACO7, 2007) (Year: 2007).*

Ostroumov et al., "Compact Carbon ION Linac," Proceedings of NAPAC2016, pp. 61-63 (2016).

Kutsaev et al., High-gradient low-β accelerating structure using the first negative spatial harmonic of the fundamental mode, Physical Review Accelerators and Beams, 20 (2017).

Mustapha et al., "Design of a High-Gradient S-Band Annular Coupled Structure," NAPAC2019, pp. 762-764 (2019).

Anferov, V., "Combined X-Y scanning magnet for conformal proton radiation therapy," Medical Physics 32, No. 3, pp. 815-818 (2005).

Ishmael et al., "Actively-Shielded, Bent Gantry System for Ion Beam Therapy Based on Round YBCO Wire", Presentation at the Applied Superconductivity Conference ASC-2016, Denver, Co, USA.

* cited by examiner

COMPACT 2D SCANNER MAGNET WITH DOUBLE-HELIX COILS

CROSS-REFERENCE TO RELATED APPLICATION

This application claims priority to U.S. Provisional Patent Application No. 63/303,339, entitled "COMPACT 2D SCANNER MAGNET WITH DOUBLE-HELIX COILS," filed on Jan. 26, 2022, the disclosure of which is hereby incorporated herein by reference.

STATEMENT REGARDING FEDERALLY SPONSORED RESEARCH OR DEVELOPMENT

This invention was made with government support under Contract No. DE-AC02-06CH11357 awarded by the United States Department of Energy to UChicago Argonne, LLC, operator of Argonne National Laboratory. The government has certain rights in the invention.

FIELD OF THE DISCLOSURE

The present disclosure relates to methods and systems for scanning ion beams, and specifically, to compact two-dimensional ("2D") scanning magnets for scanning ion beams.

BACKGROUND

Radiation therapy has been a staple of cancer treatment regimens for decades. Radiation therapy ("particle therapy") generally involves directing a beam of high energy particles such as electrons, protons, or heavy ions into a target volume (e.g., a tumor or lesion) in a patient. Particle therapy has proven to be a precise and conformal technique where a high dose of these high energy particles to a target volume can be delivered while minimizing the dose to surrounding healthy tissues.

A standard particle therapy apparatus includes an accelerator producing energetic charged particles, a beam transport system for guiding the particle beam to one or more treatment rooms and, for each treatment room, a particle beam delivery system. Generally, beam delivery systems are categorized into one of two broad categories: fixed beam delivery systems delivering the particle beam to the target from a fixed irradiation direction, and rotating beam delivery systems capable of delivering the particle beam to the target from multiple irradiation directions. Such a rotating beam delivery system is typically called a gantry, and the target volume in such systems is generally positioned at a fixed position defined by the crossing of the rotation axis of the gantry and the particle beam propagation axis.

Each beam delivery system includes devices for shaping the particle beam to match the target. Typically, particle beam shaping is performed by one of two techniques: passive scattering techniques or dynamic radiation techniques. One example of a dynamic radiation technique is the pencil beam scanning (PBS) technique. In PBS, a narrow pencil-shaped particle beam is magnetically scanned on a plane orthogonal to the propagation direction of the particle beam. Fine-tuned control of the scanning magnets enables PBS techniques (and other dynamic radiation techniques) to achieve significant lateral conformity with the target volume. Further, these dynamic radiation techniques are generally capable of irradiating different layers in the target volume by varying the energy of the particle beam, thereby enabling delivery of particle radiation doses to the entire three-dimensional (3D) target volume.

However, despite the successes of particle therapy techniques, such techniques still suffer from particle beam delivery inaccuracy that inadvertently places healthy tissue in the path of harmful radiation intended for the target volume. In particular, conventional scanning magnets used in such therapy techniques generate magnetic fields that are non-uniform in both scanning directions (e.g., X and Y directions relative to the Z direction of the particle beam propagation), causing the particle beam to deviate from the intended position during treatment. The scanning patterns produced by such conventional scanning magnets usually start at the most distal edge of the target volume at a given depth until the scanned particle beam irradiates each point of the target volume at the given depth and reaches the most proximal edge of the target object. When conventional scanning magnets direct a particle beam along the distal, proximal, and any other edge of the target object, the non-uniformities of the magnetic fields within the conventional scanning magnets may cause a charged particle (or more often, many charged particles) to deviate from the intended target area on the target volume.

The issues stemming from such deviations are two-fold. First, the deviated charged particles may inadvertently irradiate healthy tissue, causing damage to otherwise healthy organs. Second, portions of the target volume may not receive the intended dose of radiation, and may thereby remain intact/undamaged within the patient. Both issues can result in additional complications for a patient that would likely not have developed but for the inaccuracy of the conventional scanning magnets. For example, irradiating healthy tissue and failing to irradiate a target volume can lead to continued health issues for a patient (e.g., cancer recurrence), which can result in additional visits to a healthcare professional, vastly increased healthcare costs, and an overall lower quality of life.

Accordingly, there is a need for improved scanning magnets that can accurately scan particle beams during particle therapy to avoid the above-referenced issues.

SUMMARY OF THE DISCLOSURE

In an example embodiment, a compact two-dimensional (2D) scanning magnet for scanning ion beams is provided. The compact 2D scanning magnet may include an outer double-helix coil oriented along an axis, and an inner double-helix coil that is disposed within the outer double-helix coil and is rotated about the axis relative to the outer double-helix coil by an angle. The outer double-helix coil may include: a first outer coil that is configured to receive a first input electrical current flowing through the first outer coil in a first direction, and a second outer coil that is configured to receive the first input electrical current flowing through the second outer coil in a second direction that is different from the first direction. The inner double-helix coil may include a first inner coil that is configured to receive a second input electrical current flowing through the first inner coil in the first direction, and a second inner coil that is configured to receive the second input electrical current flowing through the second inner coil in the second direction. The outer double-helix coil and the inner double-helix coil may be configured to scan an input ion beam across a 2D target area.

In another example embodiment, a system for scanning ion beams is provided. The system may include an accelerator for accelerating an ion beam towards a two-dimensional (2D) target area, and a 2D scanning magnet configured to scan the ion beam across the 2D target area. The 2D scanning magnet may include: an outer double-helix coil oriented along an axis and an inner double-helix coil that is disposed within the outer double-helix coil and is rotated about the axis relative to the outer double-helix coil by an angle. The outer double-helix coil may include: a first outer coil that is configured to receive a first input electrical current flowing through the first outer coil along the axis in a first direction, and a second outer coil that is configured to receive the first input electrical current flowing through the second outer coil along the axis in a second direction that is different from the first direction. The inner double-helix coil may include: a first inner coil that is configured to receive a second input electrical current flowing through the first inner coil along the axis in the first direction, and a second inner coil that is configured to receive the second input electrical current flowing through the second inner coil along the axis in the second direction.

In a further example embodiment, a method for scanning ion beams is provided. The method may include directing an ion beam along an axis towards a 2D scanning magnet configured to scan the ion beam across a 2D target area. The 2D scanning magnet may include: an outer double-helix coil oriented along an axis and an inner double-helix coil that is disposed within the outer double-helix coil and is rotated about the axis relative to the outer double-helix coil by an angle. The outer double-helix coil may include: a first outer coil that is configured to receive a first input electrical current flowing through the first outer coil along the axis in a first direction, and a second outer coil that is configured to receive the first input electrical current flowing through the second outer coil along the axis in a second direction that is different from the first direction. The inner double-helix coil may include: a first inner coil that is configured to receive a second input electrical current flowing through the first inner coil along the axis in the first direction, and a second inner coil that is configured to receive the second input electrical current flowing through the second inner coil along the axis in the second direction. The method may also include scanning the ion beam across the 2D target area in a first direction and a second direction by sequentially adjusting a propagation direction of the ion beam with the 2D scanning magnet, wherein the first direction and the second direction are orthogonal to the axis.

BRIEF DESCRIPTION OF THE DRAWINGS

The Figures described below depict various aspects of the system and methods disclosed therein. It should be understood that each figure depicts an example of a particular aspect of the disclosed system and methods, and that each of the figures is intended to accord with a possible example thereof. Further, wherever possible, the following description refers to the reference numerals included in the following figures, in which features depicted in multiple figures are designated with consistent reference numerals.

There are shown in the drawing arrangements which are presently discussed, it being understood, however, that the present examples are not limited to the precise arrangements and instrumentalities shown, wherein.

DETAILED DESCRIPTION

The present disclosure is directed to a scanning magnet design that improves the accuracy of a particle beam (referenced herein as an "ion beam") delivered during ion beam therapy. Scanning magnets may include multiple magnets generating tunable magnetic fields that adjust the propagation direction of an input ion beam along orthogonal axes to the ion beam propagation axis. Each magnet generally includes an electrically conductive material, and electrical current is run through the material to generate the magnetic fields. As the electrical current is adjusted, so too is the corresponding magnetic field, resulting in the adjustments to the propagation direction of the input ion beam. However, in conventional scanning magnets, these magnetic fields are non-uniform in at least one direction, causing inaccuracies in the adjustments to the ion beam propagation direction.

The scanning magnet design of this disclosure includes double-helix coils of different sizes and at different orientations. The two double-helix coils are arranged such that the magnetic fields generated by both coils are significantly more uniform than conventional scanning magnets. In particular, the two double-helix coils of the present disclosure yield a more uniform transverse magnetic field and a more symmetrical longitudinal field than conventional scanning magnets. Such uniform and symmetrical magnetic fields result in a more uniform 2D scanning of ion beams during ion therapy. As a result, the scanning magnets of the present disclosure increase the accuracy of ion beams delivered during ion therapy, thereby minimizing the inadvertent irradiation of healthy tissue and maximizing the intended dose of radiation delivered to the target volume.

Moreover, the scanning magnet design of the present disclosure combines scanning of two planes with a single magnet, while most conventional systems use two magnets. Although this is not the first combined function scanner, this feature reduces the overall size of the scanning magnet. As a result, the scanning magnet design of the present disclosure also reduces the space normally required by such scanning magnets, and leads to more compact gantry systems.

Of course, it should be appreciated that the scanning magnet design of this disclosure is discussed in the context of ion beam therapy for discussion purposes only. The scanning magnet design of this disclosure may be adapted for any charged beam scanning, such as electrons, protons, etc., and for any suitable application wherein greater field uniformity is desired.

Figure 1A:
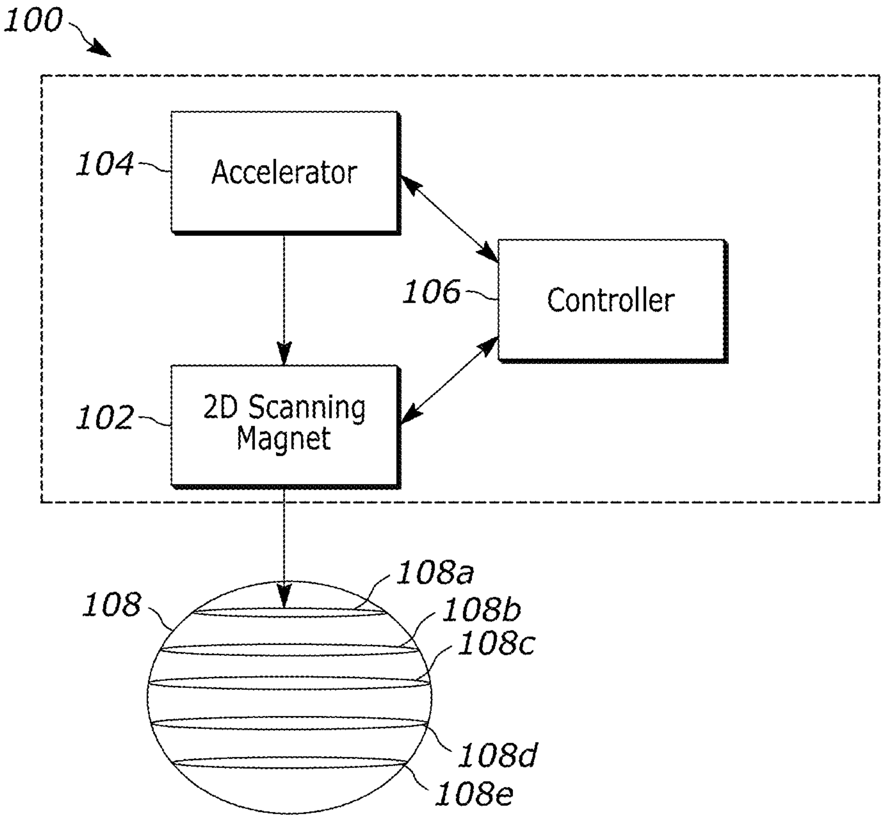
FIG. 1A illustrates an example system for scanning ion beams with a two-dimensional (2D) scanning magnet configured in accordance with the techniques of the present disclosure, in accordance with some embodiments.
Figure 1B:
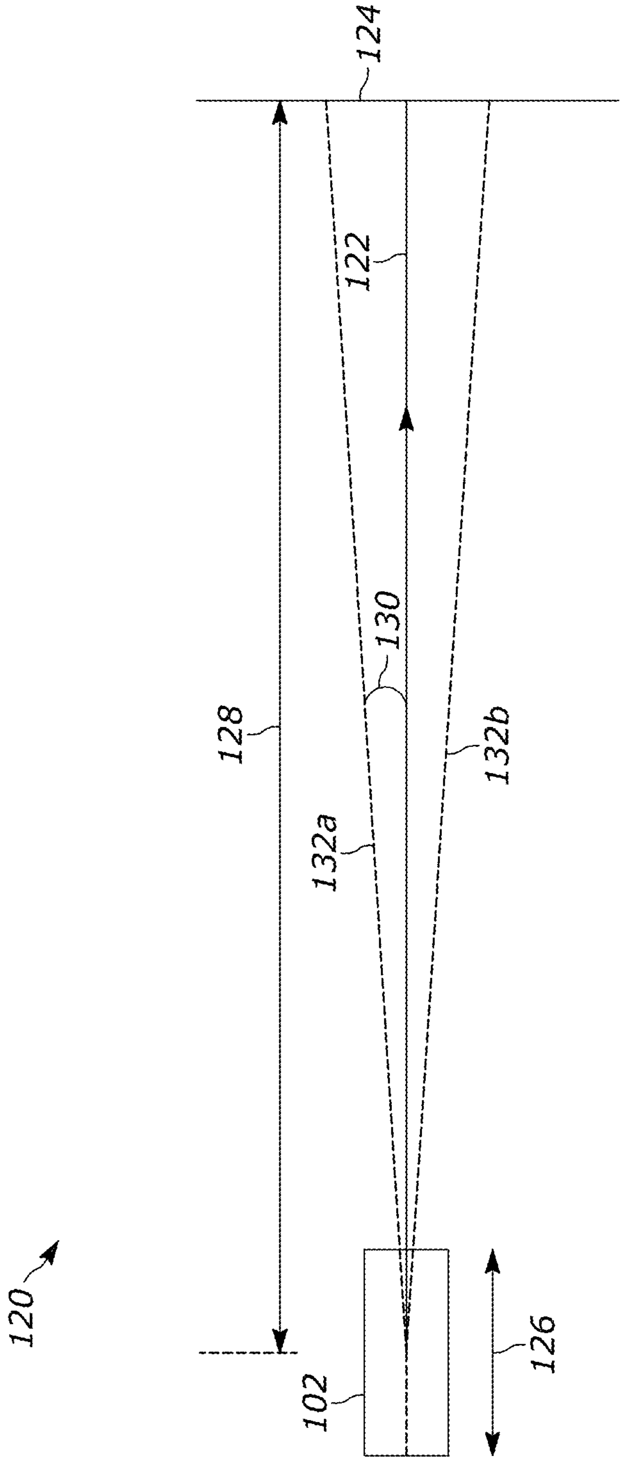
FIG. 1B illustrates an example scanning configuration for the 2D scanning magnet configured in accordance with the techniques of the present disclosure, such as the 2D scanning magnet of FIG. 1A.
Figure 2A:
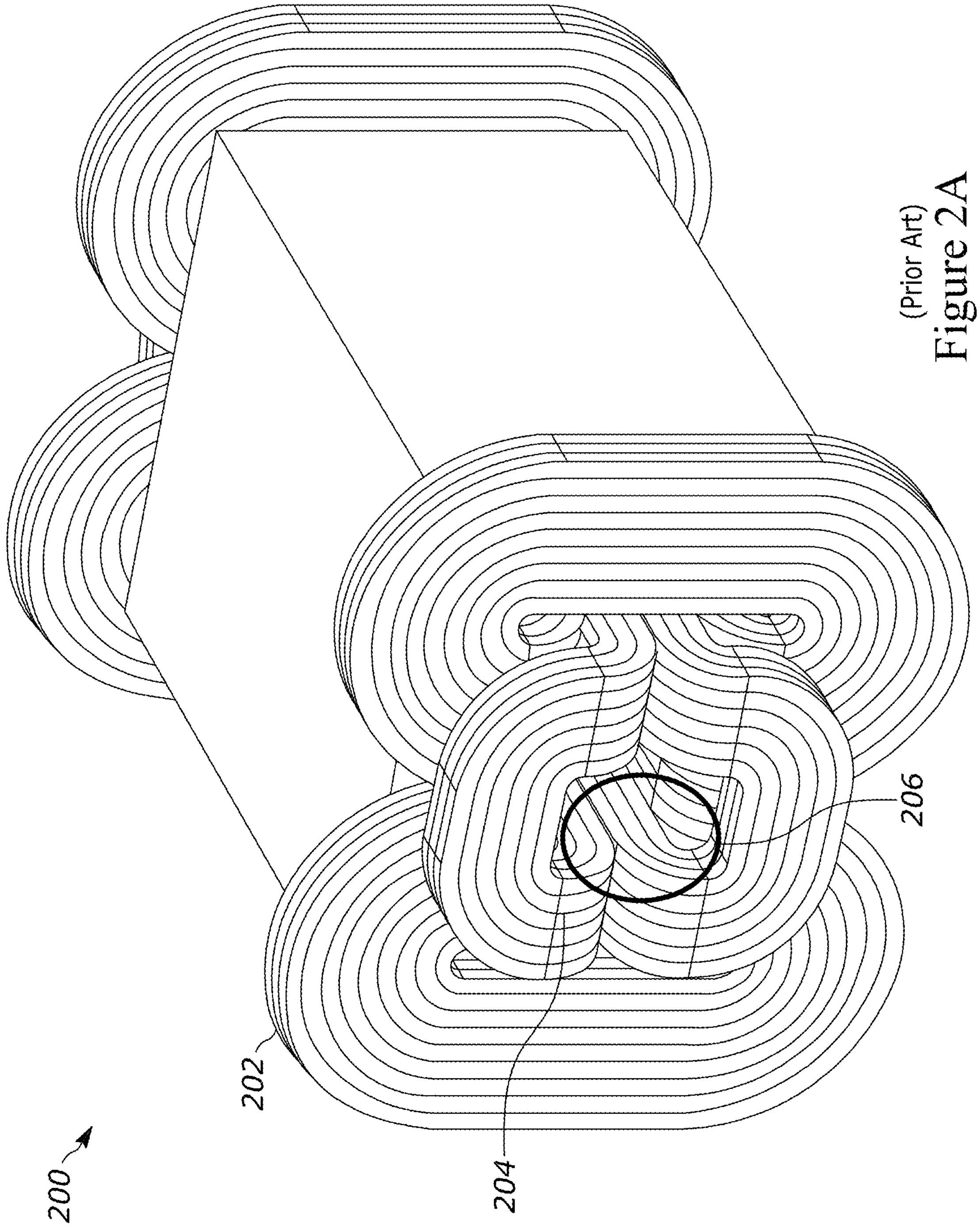
Figure 2A (Prior Art)
FIG. 2A is an example prior art scanning magnet.
Figure 2B:
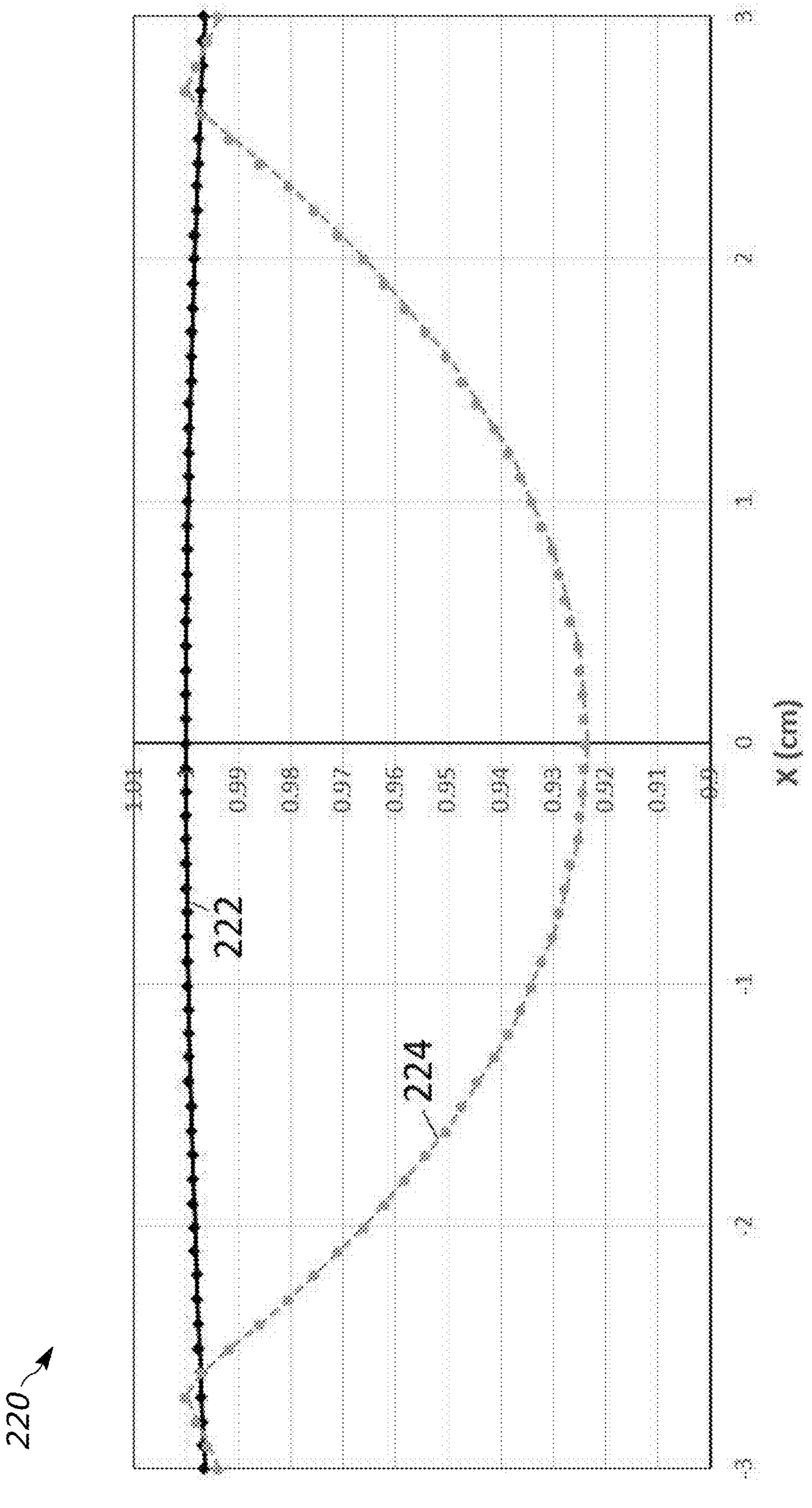
(Prior Art) Figure 2B
FIG. 2B is an example graph illustrating horizontal magnetic field profiles of the prior art scanning magnet of FIG. 2A.
Figure 2C:
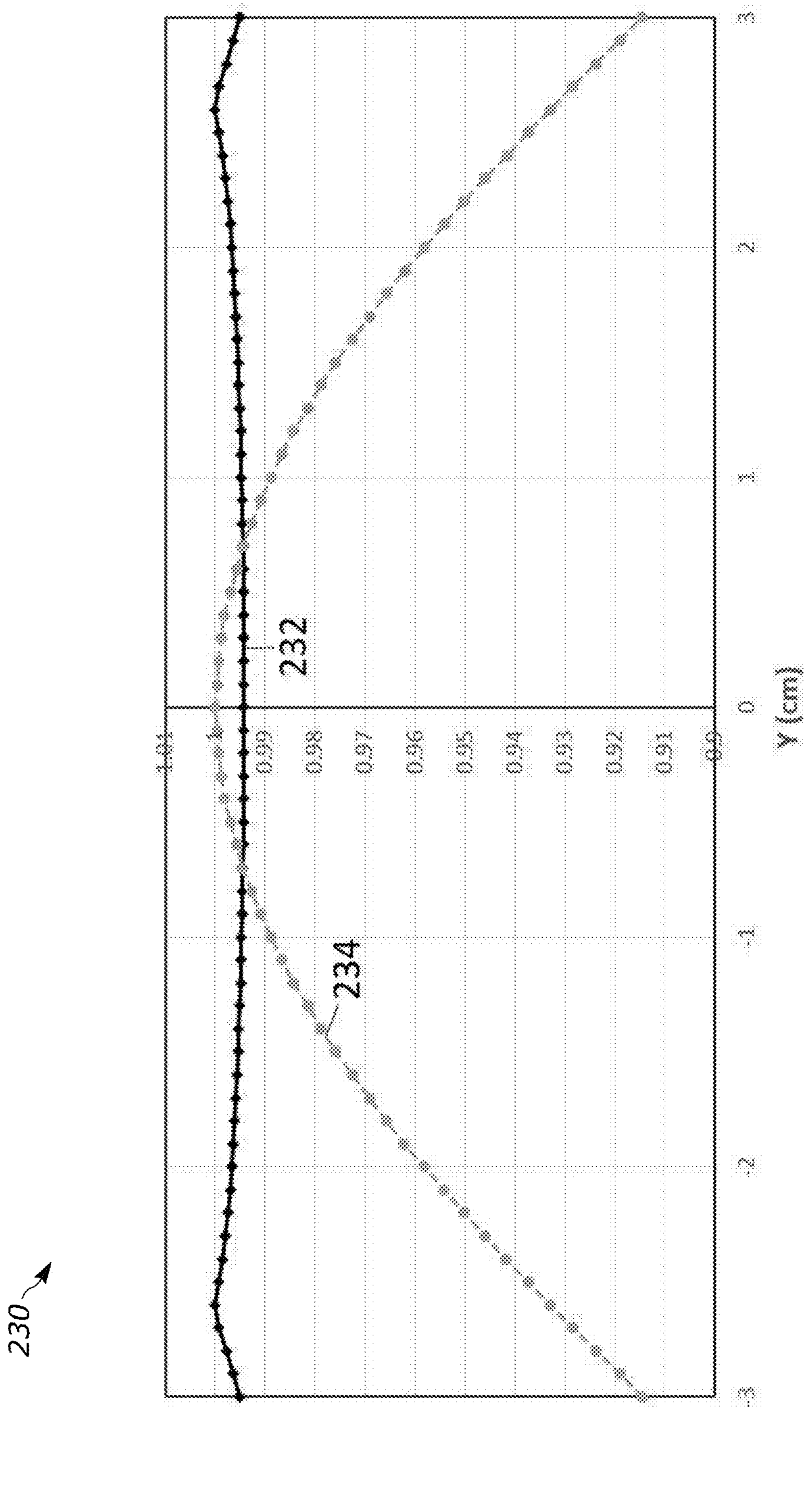
(Prior Art) Figure 2C
FIG. 2C is an example graph illustrating vertical magnetic field profiles of the prior art scanning magnet of FIG. 2A.

The scanning magnet design of this disclosure is primarily referred to with reference to FIGS. 3A-4B. FIGS. 1A and 1B are included to illustrate example environments and example operations that include the scanning magnet design of this disclosure. FIGS. 2A-2C are included to provide a better understanding of conventional scanning magnets and the issues arising therefrom.

Turning to the Figures, FIG. 1A illustrates an example system 100 for scanning ion beams with a two-dimensional (2D) scanning magnet 102 configured in accordance with the techniques of the present disclosure, in accordance with some embodiments. It should be appreciated that the example system 100 is merely an example and that alternative or additional components are envisioned. The system 100 includes the 2D scanning magnet 102, an accelerator 104, and a controller 106. Collectively, the system 100 operates to irradiate a target volume 108, which may be a tumor or other foreign object within a patient.

Generally, the accelerator 104 (e.g., a linear accelerator) may accelerate an ion beam until the beam is extracted from the accelerator 104 in order to irradiate a target volume 108. Prior to reaching the target volume 108, the ion beam passes through the 2D scanning magnet 102, where the ion beam is steered by the 2D scanning magnet in order to scan across a 2D target area of the target volume 108. The controller 106 operates to control the accelerator 104 and the 2D scanning magnet 102 such that the ion beam energy and scanning direction are adjusted appropriately to complete an ion therapy treatment. Optionally, one or more additional devices, such as a monitoring unit (not shown), an energy degrader (not shown), and/or any other suitable devices or combinations thereof may be placed along the propagation direction of the ion beam.

The target volume 108 to be irradiated by the ion beam as part of ion beam therapy treatment has a three-dimensional configuration. In some instances, to carry-out the ion beam therapy treatment, the target volume 108 is divided into target layers 108*a-e* along the irradiation direction of the ion beam so that the irradiation can be done on a layer-by-layer basis. Broadly speaking, the penetration depth (or which target layer 108*a-e* the ion beam reaches) within the target volume 108 is largely determined by the energy of the ion beam. An ion beam of a given energy does not reach substantially beyond a corresponding penetration depth for that energy. Thus, to move the ion beam irradiation from one layer to another layer of the target volume 108, thereby irradiating the entirety of the target volume 108, the controller 106 may change the energy of the ion beam.

In the example shown in FIG. 1A, the target volume 108 is divided into five target layers 108*a*-108*e* along the propagation direction of the ion beam from the 2D scanning magnet 102 to the target volume 108. In an example ion beam therapy treatment, the irradiation starts from the deepest target layer 108*e*, gradually moves to the shallower target layers (e.g., 108*b*, 108*c*, 108*d*) one layer at a time, and finishes with the shallowest target layer 108*a*. Before application to the patient's body (e.g., the target volume 108), the energy of the ion beam is controlled by the controller 106 to exit the accelerator 104 at a level sufficient to enable the ion beam to stop at a desired target layer (e.g., any of target layers 108*a*-108*e*), without substantially penetrating further into the patient's body or the target volume 108. Accordingly, and in reference to the prior example, the energy of the ion beam may sequentially decrease corresponding to the depth of the desired target layer 108*a*-108*e* relative to the system 100. In certain instances, the ion beam energy difference for treating adjacent target layers 108*a-e* of the target volume 108 may be between 3 Mega electron-volts (MeV) and 100 MeV. However, other ion beam energy differences may also be possible, depending on, e.g., the thickness of the target layers 108*a*-108*e* and the properties of the ion beam.

The energy variation for treating different target layers 108*a-e* of the target volume 108 is generally performed at the accelerator 104 such that, in some instances, no additional energy variation is required after the ion beam is extracted from the accelerator 104. In certain instances, the accelerator 108 can output ion beams having an energy that varies between about 100 MeV and about 300 MeV. The ion beam energy variation can be continuous or non-continuous (e.g., stepwise). In some instances, the accelerator 104 may vary the ion beam energy, continuously or non-continuously, at between 50 MeV per second and 20 MeV per second. More specifically, the accelerator 104 may vary the ion beam energy non-continuously with a step size between 10 MeV and 90 MeV.

When irradiation is complete in one target layer 108*a-e*, the accelerator 104 may vary the energy of the ion beam for irradiating a subsequent layer within several seconds or within less than one second. In some instances, the treatment of the target volume 108 may be continued without substantial interruption or without any interruption. Moreover, in certain circumstances, the step size of the non-continuous energy variation may be selected to correspond to the energy difference needed for irradiating two adjacent target layers 108*a-e* of the target volume 108. For example, the step size can be the identical to, or a fraction of, the energy difference needed to irradiate two adjacent target layers 108*a*-108*e*.

Regardless, when the accelerator 104 has adjusted the energy of the ion beam to irradiate a target layer 108*a-e*, the ion beam passes through the 2D scanning magnet 102 where it is scanned across the surface of the target layer 108*a-e*. The 2D scanning magnet 102 of the present disclosure includes two double-helix coils that optimally scan the ion beam across the surface of a target layer 108*a-e* without inadvertently misdirecting the ion beam due to non-uniformity of the steering magnetic fields. The controller 106 may adjust the electrical current sent to drive the 2D scanning magnet 102, and as a result, may adjust the propagation direction of the ion beam as the ion beam passes through the 2D scanning magnet 102.

To provide a better understanding of the scanning performed by the 2D scanning magnet 102, FIG. 1B illustrates an example scanning configuration 120 for the 2D scanning magnet 102 configured in accordance with the techniques of the present disclosure. The example scanning configuration 120 includes the 2D scanning magnet 102 directing an ion beam 122 (also referenced herein as a "carbon ion beam 122") towards a target volume surface 124. Generally, the 2D scanning magnet 102 may have a given length 126, and may be placed at a scan distance 128 from the target volume surface 124. As an example, the given length 126 of the 2D scanning magnet 102 may be between 40 centimeters and 60 centimeters, such as 50 centimeters, and/or any other suitable length or combinations thereof. The scan distance 128 from the 2D scanning magnet 102 to the target volume surface 124 may be between 2 meters and 4 meters, such as 3 meters, and/or any other suitable distance or combinations thereof.

However, the scan distance 128 may be determined, in part, based on the necessary scanning range of the 2D scanning magnet 102. As illustrated in FIG. 1B, the 2D scanning magnet 102 may adjust (steer) the propagation direction of the ion beam 122 through a range of motion defined by the scanning angle 130. The scanning angle 130 may represent a maximum deviation from the original propagation direction of the ion beam 122 as it enters the 2D scanning magnet 102 by which the magnet 102 is configured to adjust the propagation direction of the ion beam in order to target a portion of the target volume surface 124. For example, the adjusted ion beam paths 132*a*, 132*b* may illustrate the outer extremities of a range of paths across which the ion beam 122 may travel to irradiate the target volume surface 124.

Accordingly, if the target volume surface 124 is sufficiently large such that the ion beam 122 does not reach the edge portions of the target volume surface 124 at a particular scanning angle 130 and scan distance 128, the scan distance 128 and/or the scanning angle 130 may need to be adjusted. Typically, though, the scan distance 128 and a maximum scanning angle (e.g., scanning angle 130) are predetermined and/or otherwise properly configured such that the entirety of the target volume surface 124 are irradiated by the ion beam 122 during treatment. In any event, the scanning angle 130 may be between 3° and 5°, such as 4°, and/or any other suitable angle or combinations thereof.

More specifically, the ion beam 122 propagating through the 2D scanning magnet 102 may have a range of characteristics suitable for ion beam therapy. For example, the ion beam 122 may be comprised of carbon ions (e.g., $^{12}C^{6+}$) with a corresponding energy of 430 MeV per atomic mass unit (MeV/u) and magnetic rigidity of 6.6 tesla-meters (Tm). In order to scan an ion beam 122 comprised of heavy ions (e.g., $^{12}C^{6+}$) the 2D scanning magnet 102 may generate a peak magnetic field between 0.1 T and 1.5 T, such as 1 T, and/or any other suitable magnetic field strength value. Of course, as previously mentioned, the ion beam 122 may be comprised of any suitable particle(s) (e.g., electrons, protons).

Turning now to FIG. 2A, a prior art scanning magnet design is discussed. FIG. 2A is an example prior art scanning magnet 200. The prior art scanning magnet 200 includes a first coil 202 and a second coil 204 that are configured to receive electrical current and generate corresponding magnetic fields that steer an input particle beam. The first coil 202 is typically referenced as an "elephant ear" magnet design, and the second coil 204 is typically referenced as a "saddle design" corresponding to their respective shapes. The prior art scanning magnet 200 also includes a central aperture 206, through which, a particle beam may propagate in order to be scanned across a target volume by the prior art scanning magnet 200.

Generally, the prior art scanning magnet 200 suffers from a critical drawback. Namely, the generated magnetic fields are non-uniform in at least one direction in which the prior art scanning magnet 200 is intended to steer the particle beam. The prior art scanning magnet 200 is designed for a particle beam composed of relatively light particles (e.g., protons), and as a result, is only configured to generate magnetic fields sufficient to steer these lighter particles. However, even with these relatively light particles, the prior art scanning magnet 200 fails to achieve uniform magnetic field scanning as a consequence of the physical configuration of the magnet 200. Thus, the prior art scanning magnet 200 is insufficient to accurately steer heavier ion beams (e.g., carbon ion beam 122) that may be desirable for particular ion therapy or other therapies/applications due to the high levels of non-uniformity in the generated magnetic fields.

Moreover, as a consequence of the designs of the first coil 202 and the second coil 204, the magnetic fields generated by both coils 202, 204 are non-uniform in at least one direction in which the particle beam is scanned by the prior art scanning magnet 200. To illustrate this non-uniformity, FIG. 2B provides a graph 220 showing the horizontal magnetic field profiles of the prior art scanning magnet 200. The graph 220 may show a measure of uniformity corresponding to the respective magnetic field components of the horizontal scanning magnet of the prior art scanning magnet 200 plotted as a function of the lateral position within the central aperture 206 of the prior art scanning magnet 200. The central aperture 206 may generally have a diameter of approximately 6 centimeters (cm), such that the lateral center of the central aperture 206 is designated by 0 on the x-axis, and the +/−3 cm values on the x-axis may approximately represent the lateral extremities of the central aperture 206.

As illustrated in FIG. 2B, the prior art scanning magnet 200 generates a magnetic field that has components in the horizontal direction (e.g., a lateral direction) relative to the propagation direction of the particle beam, represented by the horizontal field plot line 222. The magnetic field generated by the prior art scanning magnet 200 also has components in the vertical direction relative to the propagation direction of the particle beam, represented by the vertical field plot line 224. The graph 220 shows that the magnetic field is relatively uniform in the horizontal direction, and is generally within 1% of complete uniformity throughout the lateral width of the central aperture 206 of the prior art scanning magnet 200.

However, the graph 220 also shows that the magnetic field is relatively non-uniform in the vertical direction, and deviates by up to approximately 10% of complete uniformity near the center of the central aperture 206 of the prior art scanning magnet 200. As previously mentioned, this non-uniformity in the vertical direction may cause inadvertent adjustments to the scanning of the particle beam, which in turn, may result in inadvertent damage to healthy tissue surrounding a target volume (e.g., target volume 108). Accordingly, a particle traveling as part of the particle beam through the central aperture 206 of the prior art scanning magnet 200 may travel through the center of the central aperture 206, experience an unintended adjustment to its propagation direction resulting from the non-uniformity in the vertical magnetic field, and exit the central aperture 206 on a collision course with healthy tissue.

This non-uniformity issue is also present in the magnetic fields generated by the prior art scanning magnet 200 in the vertical scanning plane, as illustrated in FIG. 2C. In particular, FIG. 2C provides a graph 230 showing magnetic field profiles across a vertical scanning plane of the prior art scanning magnet 200. The graph 230 may show a measure of uniformity corresponding to the respective magnetic field components of the prior art scanning magnet 200 plotted as a function of the vertical position within the central aperture 206 of the prior art scanning magnet 200. As previously mentioned, the central aperture 206 may generally have a diameter of approximately 6 centimeters, and as a result, the vertical center of the central aperture 206 is designated by 0 on the x-axis, and the +/−3 centimeter values on the x-axis may approximately represent the vertical extremities of the central aperture 206.

As illustrated in FIG. 2C, the prior art scanning magnet 200 generates a magnetic field that has components in the horizontal direction (e.g., a lateral direction) relative to the propagation direction of the particle beam, represented by the horizontal field plot line 232. The magnetic field generated by the prior art scanning magnet 200 also has components in the vertical direction relative to the propagation direction of the particle beam, represented by the vertical field plot line 234. The graph 230 shows that the magnetic field is relatively uniform in the horizontal direction, and is generally within 1% of complete uniformity throughout the vertical width of the central aperture 206 of the prior art scanning magnet 200.

However, the graph 230 also shows that the magnetic field is relatively non-uniform in the vertical direction, and deviates by up to approximately 9% of complete uniformity near the vertical extremities of the central aperture 206 of the prior art scanning magnet 200. As previously mentioned, this non-uniformity in the vertical direction may cause inadvertent adjustments to the scanning of the particle beam, which in turn, may result in inadvertent damage to healthy tissue surrounding a target volume (e.g., target volume 108). Accordingly, a particle traveling as part of the particle beam through the central aperture 206 of the prior art scanning magnet 200 may travel near a vertical extremity of the central aperture 206, experience an unintended adjustment to its propagation direction resulting from the non-uniformity in the vertical magnetic field, and leave the central aperture 206 on a collision course with healthy tissue.

Figure 3A:
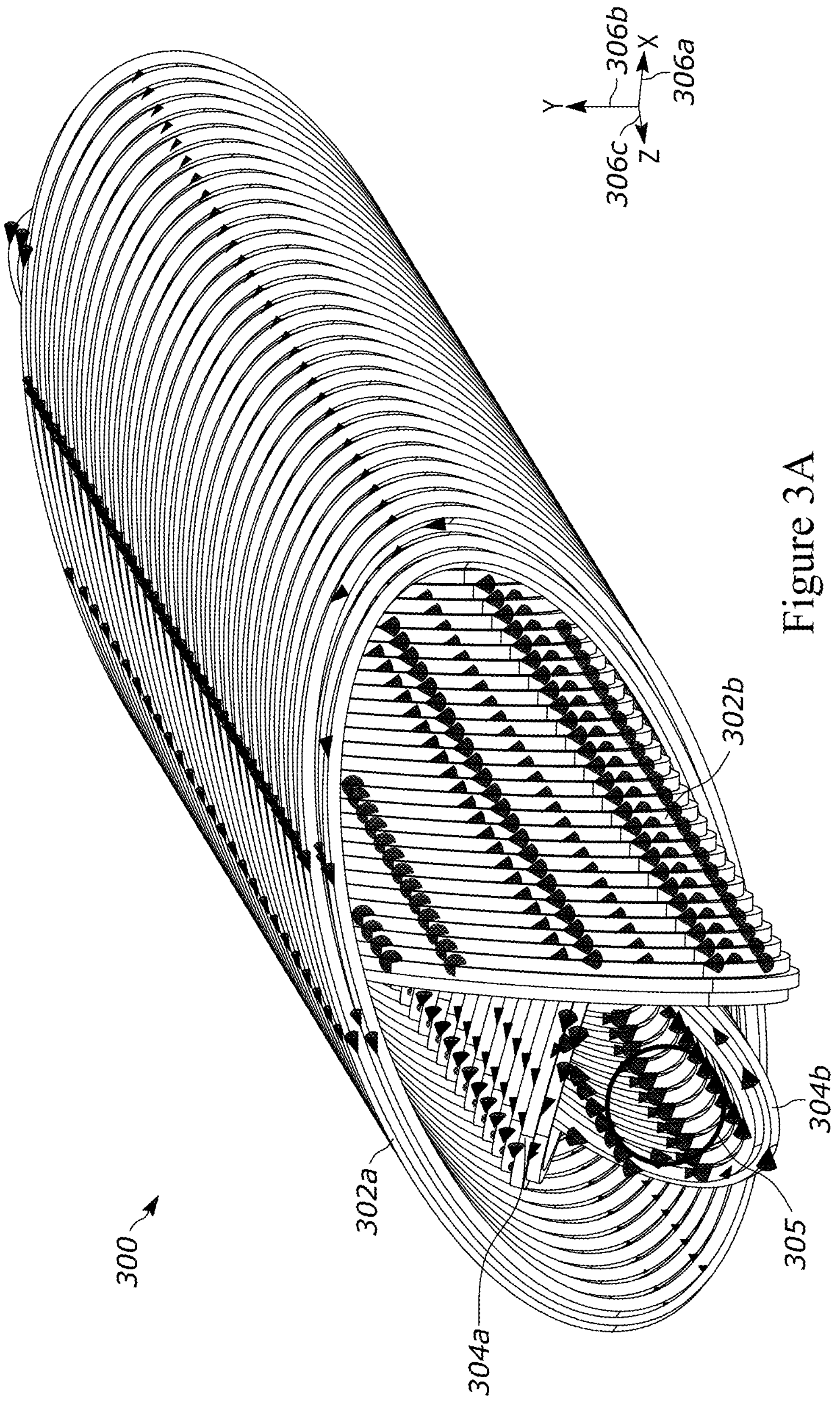
FIG. 3A is an example 2D scanning magnet configured in accordance with the techniques of the present disclosure for scanning ion beams, in accordance with some embodiments.

Advantageously, these magnetic field non-uniformity issues are overcome by the 2D scanning magnet design of the present disclosure. In particular, the 2D scanning magnet design of the present disclosure is illustrated in FIG. 3A. Generally speaking, the 2D scanning magnet 300 is comprised of multiple helix-shaped coils, including an outer double-helix coil that comprises a first outer coil 302*a* and a second outer coil 302*b*, an inner double-helix coil that comprises a first inner coil 304*a* and a second inner coil 304*b*, and a central aperture 305 through which an ion beam may propagate to be scanned across a 2D target area of a target volume (e.g. target volume 108). The first outer coil 302*a* and the second outer coil 302*b* may be tilted in opposite directions relative to one another in order to generate a pure dipole magnetic field with almost no high-order components. Similarly, the first inner coil 304*a* and the second inner coil 304*b* may be tilted in opposite directions from one another in order to create a similar dipole magnetic field. In this manner, the outer-double helix coil and the inner double helix coil generate magnetic fields that increase the total field uniformity relative to prior art systems (e.g., prior art scanning magnet 200), such that the magnetic field in both scanning directions is uniform to within approximately 1% or better. In certain instances, the 2D scanning magnet 300 may be the 2D scanning magnet 102 of FIGS. 1A and 1B.

To more clearly explain how the coils are tilted, the coordinates in FIG. 3A may be used for reference. The coordinates include an X axis 306*a*, a Y axis 306*b*, and a Z axis 306*c*. The Z axis 306*c* may be parallel to the propagation direction of an ion beam through the 2D scanning magnet 300. The Y axis 306*b* may be perpendicular to the propagation direction of an ion beam through the 2D scanning magnet 300, and may correspond to vertical movement relative to the propagation direction of the ion beam. The X axis 306*a* may be perpendicular to the propagation direction of an ion beam through the 2D scanning magnet 300, and may correspond to horizontal movement relative to the propagation direction of the ion beam. Thus, as illustrated in FIG. 3A, the first outer coil 302*a* and the second outer coil 302*b* as well as the first inner coil 304*a* and the second inner coil 304*b* may be tilted along the Z axis 306*c* in opposite directions to create the outer/inner double-helix coil.

Moreover, the outer double-helix coil may be rotated around the Z axis 306*c* relative to the inner double-helix coil. For example, the outer double-helix coil may be rotated, and thereby offset, relative to the inner double-helix coil by an angle of between 80°-100° around the Z axis 306*c*, and more particularly, by an angle of 90° around the Z axis 306*c*. However, it should be appreciated that the outer double-helix coil may be rotated around any suitable axis relative to the inner double-helix coil, by any suitable angle, and in certain instances, may not be rotated relative to the inner double-helix coil.

In particular, the tilt angle of the coils may be configured to maximize the magnetic field integral, thereby providing an optimal magnetic field through the 2D scanning magnet 300. The tilt angle for any particular coil may be measured from one of the three axes 306*a-c*. For example, the tilt angle for the first outer coil 302*a* may be measured relative to the Z axis 306*c* or the X axis 306*a* because the tilt plane of the first outer coil 302*a* is co-planar with the plane formed by the Z axis 306*c* and the X axis 306*a*. Similarly, as illustrated in FIG. 3A, the tilt angle for the second inner coil 304*b* may be measured relative to the Z axis 306*c* or the Y axis 306*b* because the tilt plane of the second inner coil 304*b* is co-planar with the plane formed by the Z axis 306*c* and the Y axis 306*b*. However, for the purposes of discussion only, the tilt angles referenced herein are relative to the respective axes that are perpendicular to the propagation direction of an ion beam through the 2D scanning magnet 300 (here, the Z axis 306*c*).

In any event, a tilt angle of 60° may generally provide a maximal field integral at a given number of coil turns, but the tilt angle may generally be between 45° and 75°. The optimal tilt angle may also vary based on various factors, such as the number of coil turns and the number of coil layers. As illustrated in FIG. 3A, the outer double-helix coil includes 4 layers, and the inner double-helix coil includes 4 layers. The coil layers are concentrically layered, such that the first outer coil 302*a* includes an outer layer of coils and an inner layer of coils, and the second outer coil 302*b* similarly includes an outer layer of coils and an inner layer of coils, resulting in 4 total coil layers for the outer double-helix coil. It will be appreciated that the outer double-helix coil and the inner double-helix coil may have any suitable number of coil layers, such as 2, 4, 6, and/or any other suitable number.

Additional coil layers may, for example, add approximately 0.1 Tesla to the peak magnetic field. However, in order to maintain a uniform and symmetric magnetic field, for every additional layer added to either an inner or outer coil, an oppositely titled layer added to the other coil is needed to cancel the unwanted components of the magnetic field. For example, if an additional coil layer is added to the first outer coil 302*a*, then an additional coil layer must be added to the second outer coil 302*b* in order to keep the resulting magnetic field symmetric and uniform. Additionally, the inner double-helix coil and the outer double-helix coil may be independently configured to have different magnetic rigidity values that are sufficient for steering particle beams comprising any suitable particles (e.g., proton beams, ion beams). As an example, the inner double-helix coil may be configured for a magnetic rigidity between 1.0-1.5 Tesla-meter, and the outer double-helix coil may be configured for a magnetic rigidity between 1.4-1.6 Tesla-meter. Of course, the magnetic rigidity values for the inner double-helix coil and/or the outer double-helix coil may be any suitable values.

Further, both the outer double-helix coil and the inner double-helix coil include a certain number of coil turns representing the number of individual coil loops comprising the respective double-helix coils. For example, the first outer coil 302*a* may be comprised of 49 individual coil loops in the outer layer and 47 individual coil loops in the inner layer, and the second outer coil 302*b* may be comprised of 43 individual coil loops in the outer layer and 41 individual coil loops in the inner layer. Continuing this example, the first inner coil 304*a* may be comprised of 39 individual coil loops in the outer layer and 37 individual coil loops in the inner layer, and the second inner coil 304*b* may be comprised of 33 individual coil loops in the outer layer and 31 individual coil loops in the inner layer.

Figure 3B:
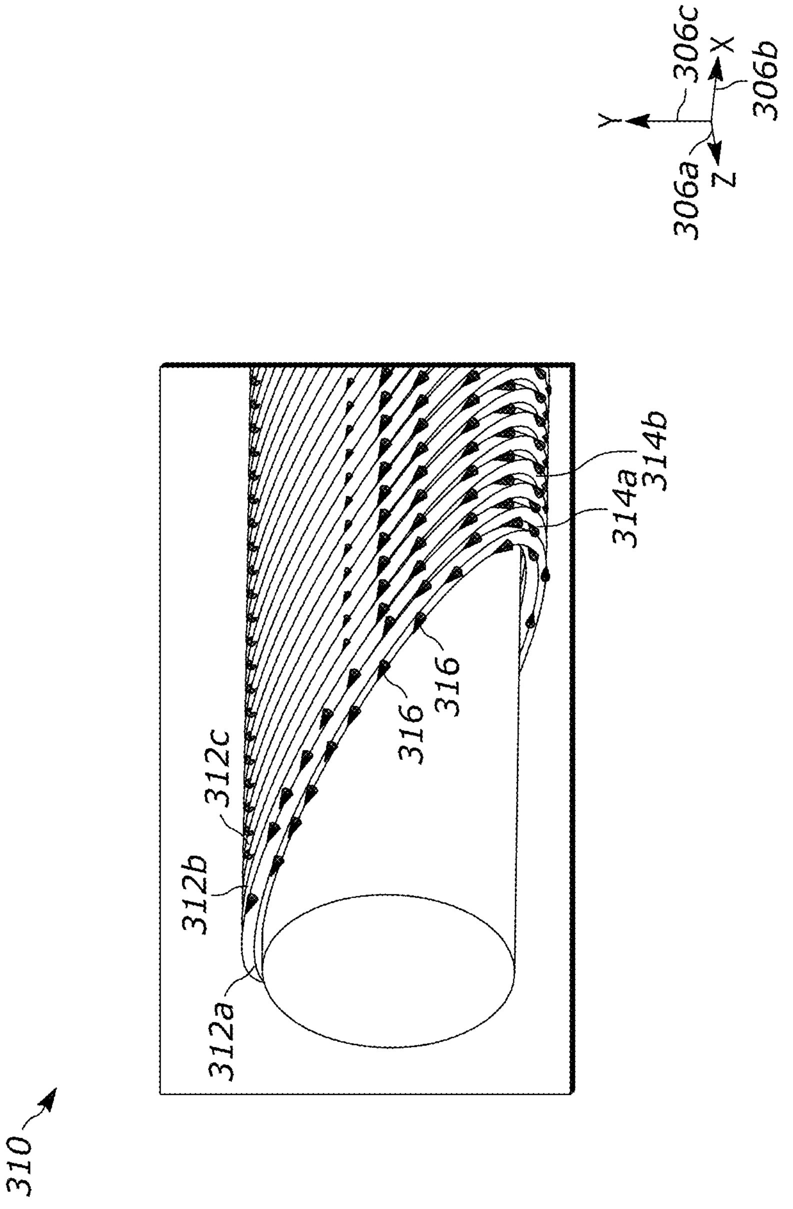
FIG. 3B is a close-up view of a coil of an example 2D scanning magnet, in accordance with some embodiments.

To provide a better understanding of the coil turns, FIG. 3B is a close-up view of a coil 310 of the 2D scanning magnet 300, in accordance with some embodiments. As illustrated in FIG. 3B, the coil 310 includes a first coil turn 312*a*, a second coil turn 312*b*, and a third coil turn 312*c*. The coil 310 additionally includes a coil spacing 314*a-b* between each of the coil turns 312*a-c*. The coil spacing 314*a-b* may be a consistent spacing between each coil turn that is part of the coil 310, and the spacing may be between, for example, 0.25 millimeters and 0.55 millimeters. As illustrated in FIG. 3B, the coil 310 also includes current direction indicators 316 that represent the flow of current through the coil 310, and a hollow tube 318 placed within the coil 310.

In certain aspects, the 2D scanning magnet 300 may include the hollow tube 318 placed within the inner double-helix coil. The hollow tube 318 may have thin walls sufficient to allow the carbon ion beam 122 to pass through the central aperture 305 of the 2D scanning magnet 300.

Figure 3C:
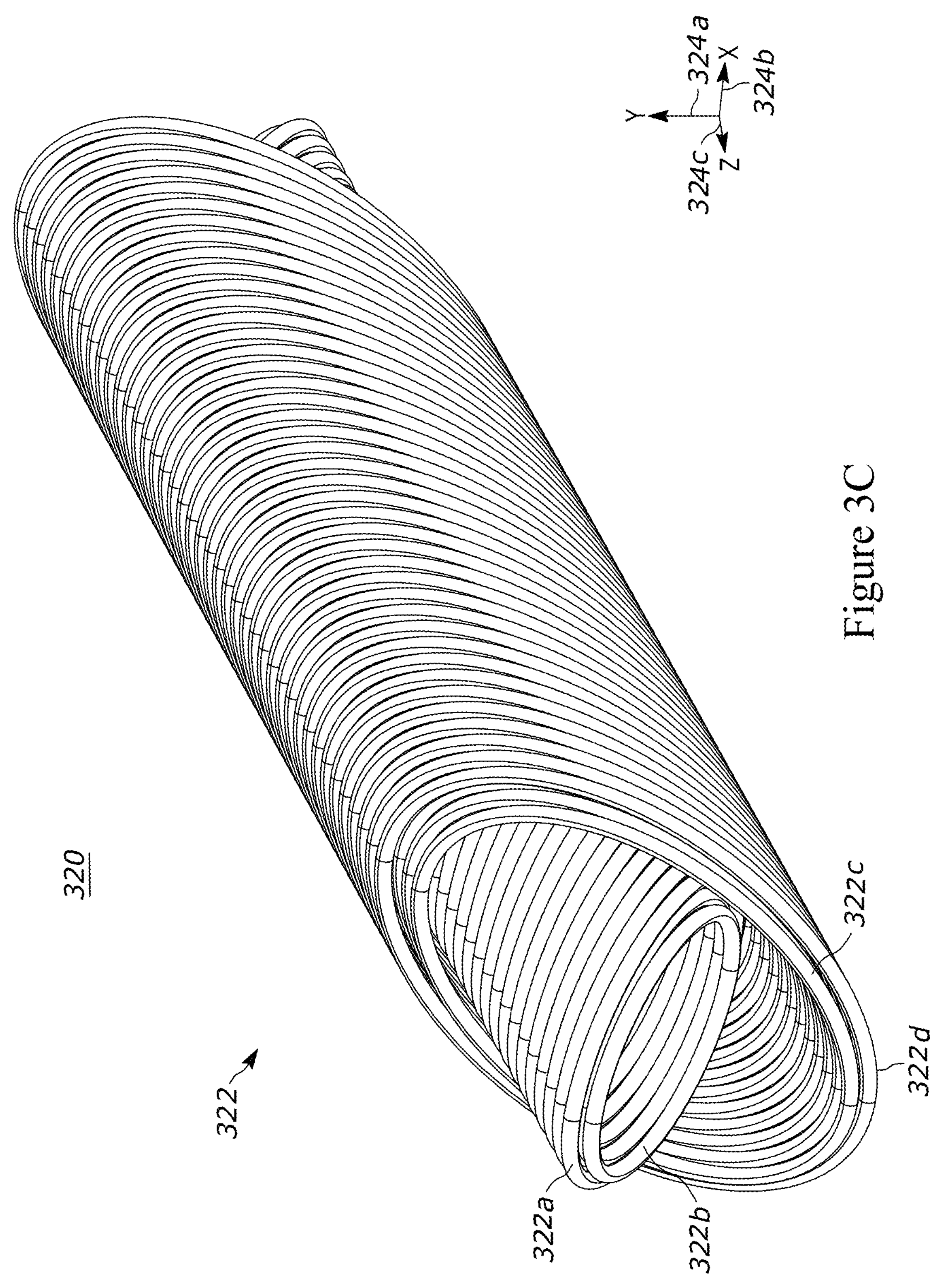
FIG. 3C is a representative three-quarter view of an example inner double-helix coil of an example 2D scanning magnet, in accordance with some embodiments.

Moreover, to provide a clearer illustration of the 2D scanning magnet 300 structure, FIG. 3C is a representative three-quarter view 320 of an example inner double-helix coil 322 of an example 2D scanning magnet (e.g., 300), in accordance with some embodiments. The example inner double-helix coil 322 includes 4 concentric coil layers including a first coil layer 322*a*, a second coil layer 322*b*, a third coil layer 322*c*, and a fourth coil layer 322*d*. The representative three-quarter view 320 also includes three axes, a first axis 324*a*, a second axis 324*b*, and a third axis 324*c*. For ease of discussion, the first axis 324*a* may be the Y axis (e.g., Y axis 306*c*), the second axis 324*b* may be the X axis (e.g., X axis 306*b*), the third axis 324*c* may be the Z axis (e.g., Z axis 306*a*).

As previously mentioned, the inner-outer double-helix coils may have concentric layers that comprise the first/second coils for each respective double-helix coil. In this example inner double-helix coil 322, the first coil layer 322*a* and the second coil layer 322*b* may comprise a first inner coil of the example inner double-helix coil 322, and the third coil layer 322*c* and the fourth coil layer 322*d* may comprise a second inner coil of the example inner double-helix coil 322. More specifically, the first coil layer 322*a* may fully encompass (e.g., surround) the second coil layer 322*b*, and the fourth coil layer 322*d* may fully encompass the third coil layer 322*c*, thereby forming concentric coil layers. In this manner, the example inner double-helix coil 322 is comprised of a first inner coil that is a concentric layering of the first coil layer 322*a* and the second coil layer 322*b*, and a second inner coil that is a concentric layering of the third coil layer 322*c* and the fourth coil layer 322*d*. Further, in certain aspects, the second inner coil may fully encompass the first inner coil, such that the fourth coil layer 322*d* fully encompasses each of the third coil layer 322*c*, the first coil layer 322*a*, and the second coil layer 322*b*.

As illustrated in FIG. 3C, the example inner double-helix coil 322 is oriented along the Z axis 324*c*, such that an ion beam transmitting through the center of the inner double-helix coil 322 may transmit in a direction parallel to the Z axis 324*c*. When an electrical current is input to the inner double-helix coil 322, the electrical current may flow through the first coil layer 322*a* and the second coil layer 322*b* in a first direction that is indicated by the arrow representative of the Z axis 324*c*. Conversely, the electrical current may flow through the third coil layer 322*c* and the fourth coil layer 322*d* in a second direction that is antiparallel to the arrow representative of the Z axis 324*c*.

In particular, the input electrical current may flow through each of the coil layers 322*a-d* in a continuous manner. For example, the input electrical current to the example inner double-helix coil 322 may initially be received at an input lead where the input electrical current may flow through the fourth coil layer 322*d* and the third coil layer 322*c*. Thereafter, the input electrical current may flow from the fourth coil layer 322*d* and the third coil layer 322*c* to the first coil layer 322*a* and the second coil layer 322*b*. When the input electrical current flows through the first coil layer 322*a* and the second coil layer 322*b*, the input electrical current may exit the example inner double-helix coil 322 through an exit lead.

Additionally, each coil layer 322*a-d* of the example inner double-helix coil 322 may include a different number of coil turns that are each representative of an individual coil loop. For example, the fourth coil layer 322*d* may be comprised of 39 individual coil loops, the third coil layer 322*c* may be comprised of 37 individual coil loops, the first coil layer 322*a* may be comprised of 33 individual coil loops, and the second coil layer 322*b* may be comprised of 31 individual coil loops. Of course, this example is for the purposes of discussion only, and the double-helix coils of the present disclosure may include any suitable number of coil turns.

Figure 3E:
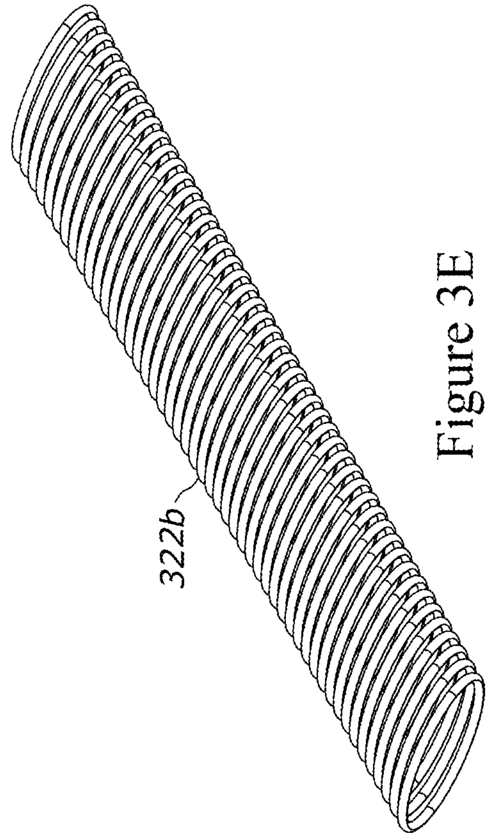
FIGS. 3D-3G are each representative of individual coil layers of the example inner double-helix coil of FIG. 3C, and in accordance with some embodiments.
Figure 3D:
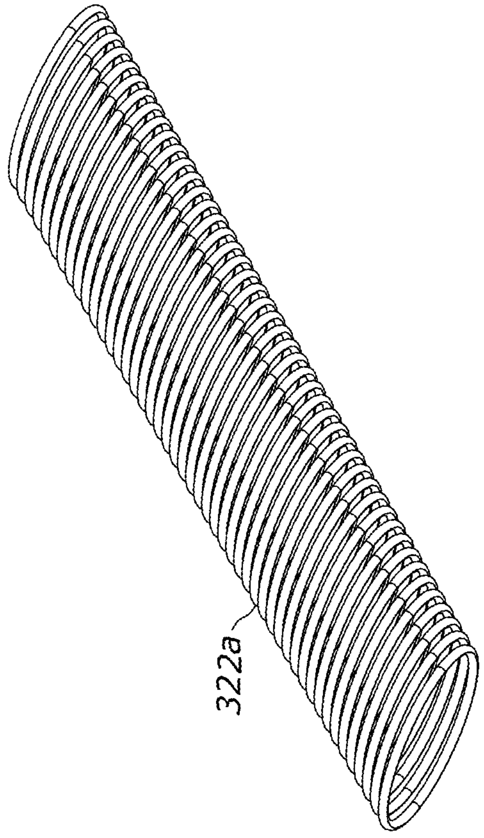
Figure 3G:
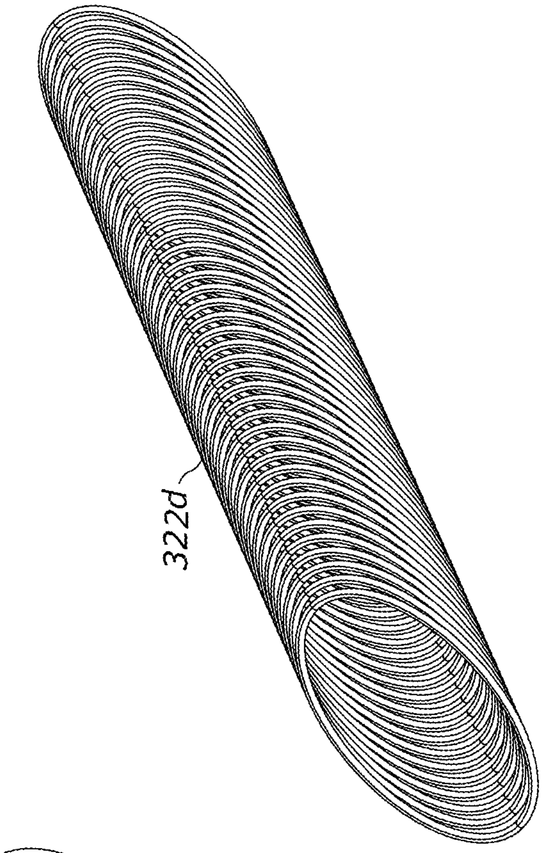
Figure 3F:
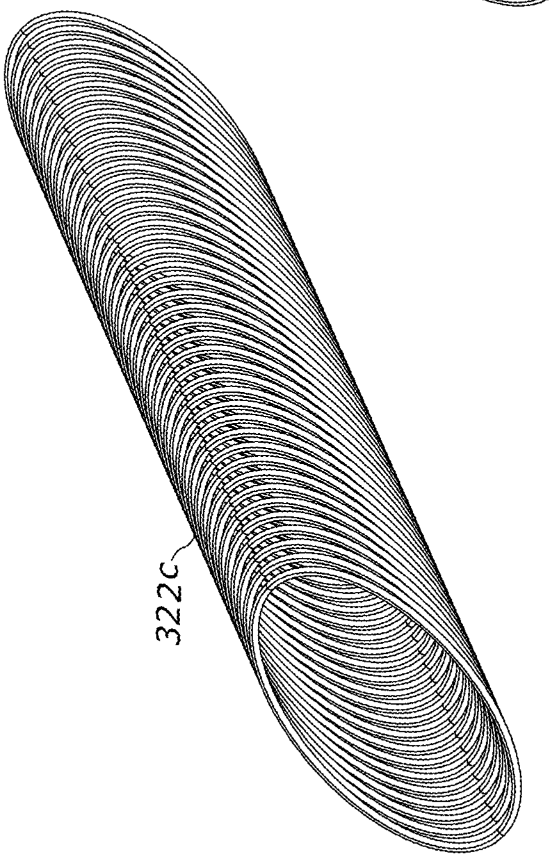

FIGS. 3D-3G are each representative of individual coil layers of the example inner double-helix coil 322 of FIG. 3C, and in accordance with some embodiments. In particular, the first coil layer 322*a* is illustrated in FIG. 3D, the second coil layer 322*b* is illustrated in FIG. 3E, the third coil layer 322*c* is illustrated in FIG. 3F, and the fourth coil layer 322*d* is illustrated in FIG. 3G. As previously mentioned, each of these coil layers 322*a-d* may be concentrically configured, such that the first coil layer 322*a* completely encompasses the second coil layer 322*b*. Moreover, the fourth coil layer 322*d* may completely encompass the third coil layer 322*c*, and both the fourth coil layer 322*d* and the third coil layer 322*c* may completely encompass the first coil layer 322*a* and the second coil layer 322*b*.

Figure 3H:
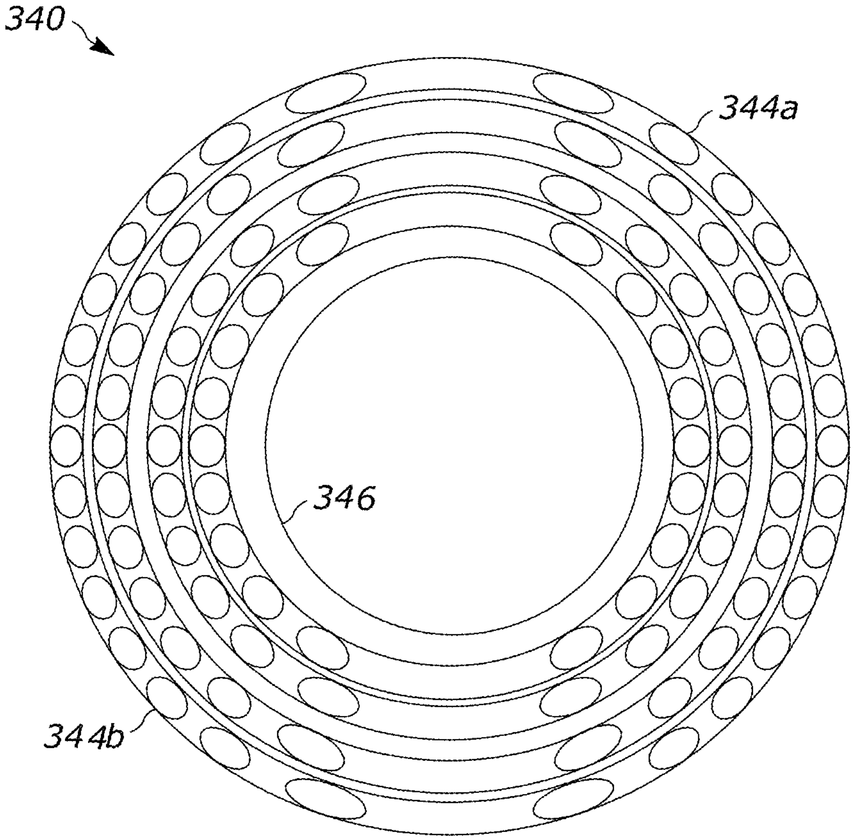
FIG. 3H is a cross-sectional view of the example inner double-helix coil of FIG. 3C, in accordance with some embodiments.

FIG. 3H is a cross-sectional view 340 of the example inner double-helix coil 322 of FIG. 3C, in accordance with some embodiments. The cross-sectional view 340 generally represents the configuration of the example inner double-helix coil 322 as viewed along the Z axis 324*c* of FIG. 3C.

As illustrated in FIG. 3H, the cross-sectional view 340 includes 4 layers of coil indications 344*a*, 344*b*, that are representative of the coil layers 322*a-d* of the example inner double-helix coil 322. In certain instances, the respective layers of the coil indications 344*a*, 344*b* may not correlate directly to the coil layers 322*a-d*. For example, the first coil indication 344*a* may be representative of a portion of any of the first coil layer 322*a*, the second coil layer 322*b*, the third coil layer 322*c*, or the fourth coil layer 322*d*. Similarly, the second coil indication 344*b* may be representative of a portion of any of the first coil layer 322*a*, the second coil layer 322*b*, the third coil layer 322*c*, or the fourth coil layer 322*d*.

Moreover, the cross-sectional view 340 indicates the overall symmetry of the inner double-helix coil 322, resulting in symmetric magnetic fields for scanning an ion beam, and that the central aperture 346 remains unobscured by the coil 322. As illustrated in FIG. 3H, the central aperture 346 may be a circle with a diameter of approximately 6 centimeters, and in certain instances, the central aperture 346 may be the central aperture 305.

Figure 3I:
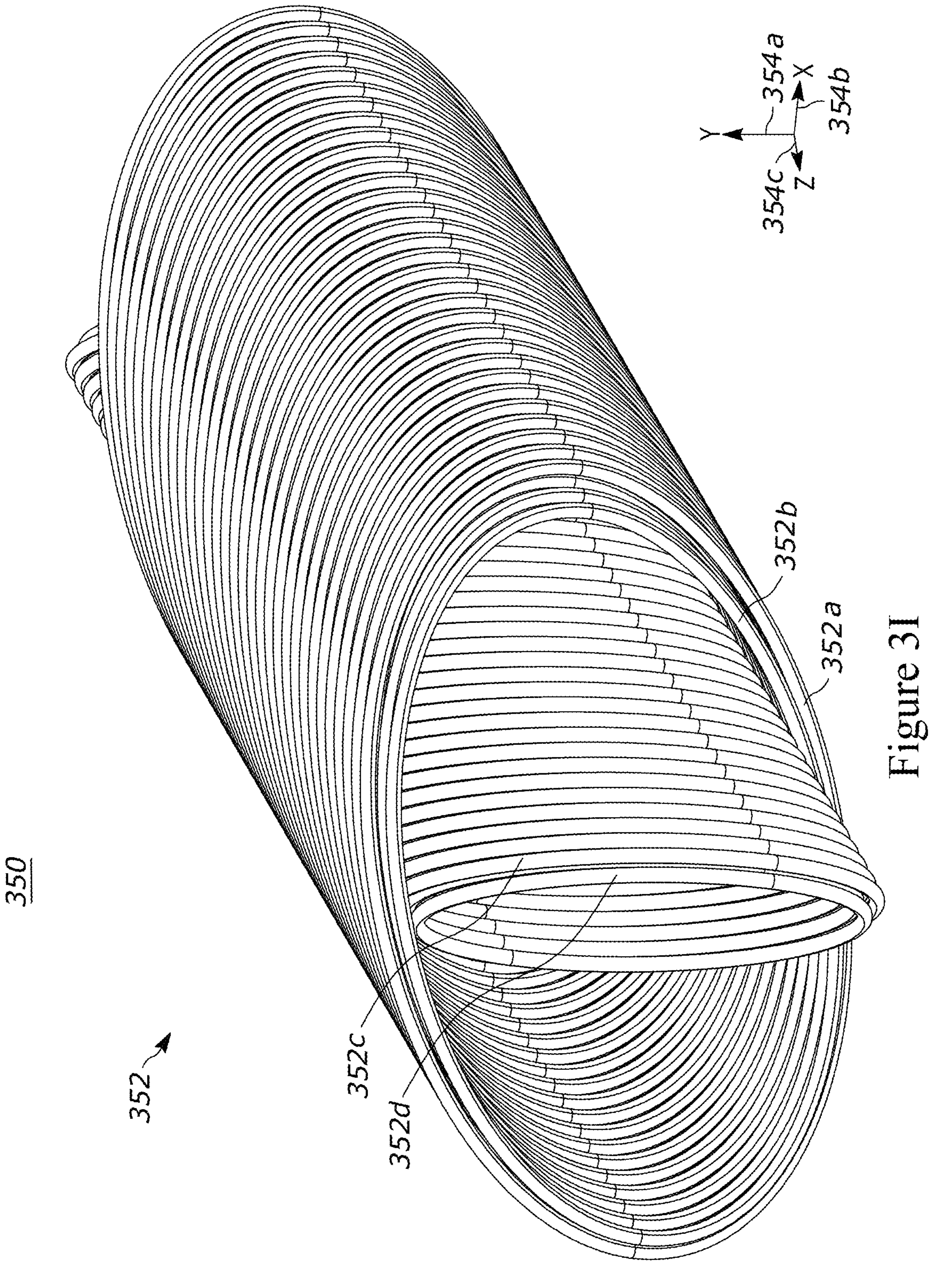
FIG. 3I is a representative three-quarter view of an example outer double-helix coil of an example 2D scanning magnet, in accordance with some embodiments.

FIG. 3I is a representative three-quarter view 350 of an example outer double-helix coil 352 of an example 2D scanning magnet (e.g., 300), in accordance with some embodiments. The example outer double-helix coil 352 includes 4 concentric coil layers including a first coil layer 352*a*, a second coil layer 352*b*, a third coil layer 352*c*, and a fourth coil layer 352*d*. The representative three-quarter view 350 also includes three axes, a first axis 354*a*, a second axis 354*b*, and a third axis 354*c*. For ease of discussion, the first axis 354*a* may be the Y axis (e.g., Y axis 306*c*), the second axis 354*b* may be the X axis (e.g., X axis 306*b*), the third axis 354*c* may be the Z axis (e.g., Z axis 306*a*.

As previously mentioned, the inner-outer double-helix coils may have concentric layers that comprise the first/second coils for each respective double-helix coil. In this example outer double-helix coil 352, the first coil layer 352*a* and the second coil layer 352*b* may comprise a first outer coil of the example outer double-helix coil 352, and the third coil layer 352*c* and the fourth coil layer 352*d* may comprise a second outer coil of the example outer double-helix coil 352. More specifically, the first coil layer 352*a* may fully encompass (e.g., surround) the second coil layer 352*b*, which may fully encompass the third coil layer 352*c* and the fourth coil layer 352*d*. In this manner, the example outer double-helix coil 352 is comprised of a first inner coil that is a concentric layering of the first coil layer 352*a* and the second coil layer 352*b*, and a second inner coil that is a concentric layering of the third coil layer 352*c* and the fourth coil layer 352*d*.

As illustrated in FIG. 3I, the example outer double-helix coil 352 is oriented along the Z axis 354*c*, such that an ion beam transmitting through the center of the outer double-helix coil 352 may transmit in a direction parallel to the Z axis 354*c*. When an electrical current is input to the outer double-helix coil 352, the electrical current may flow through the first coil layer 352*a*, and the second coil layer 352*b* in a first direction that is antiparallel to the arrow representative of the Z axis 354*c*. Conversely, the electrical current may flow through the third coil layer 352*c* and the fourth coil layer 352*d* in a second direction that is indicated by the arrow representative of the Z axis 354*c*.

In particular, the input electrical current may flow through each of the coil layers 352*a-d* in a continuous manner. For example, the input electrical current to the example outer double-helix coil 352 may initially be received at an input lead where the input electrical current may flow through the first coil layer 352*a* and the second coil layer 352*b*. Thereafter, the input electrical current may flow from the first coil layer 352*a* and the second coil layer 352*b* to the third coil layer 352*c* and the fourth coil layer 352*d*, where the input electrical current exits the example outer double-helix coil 352 through an exit lead.

Additionally, each coil layer 352*a-d* of the example outer double-helix coil 352 may include a different number of coil turns that are each representative of an individual coil loop. For example, the first coil layer 352*a* may be comprised of 49 individual coil loops, the second coil layer 352*b* may be comprised of 47 individual coil loops, the third coil layer 352*c* may be comprised of 45 individual coil loops, and the fourth coil layer 352*d* may be comprised of 43 individual coil loops. Of course, this example is for the purposes of discussion only, and the double-helix coils of the present disclosure may include any suitable number of coil loops and/or coil layers. As another example, the example outer double-helix coil 352 may include 6 coil layers, such that the coil layers include 49 coil loops, 47 coil loops, 45 coil loops, 43 coil loops, 41 coil loops, and 39 coil loops, respectively.

Figure 3K:
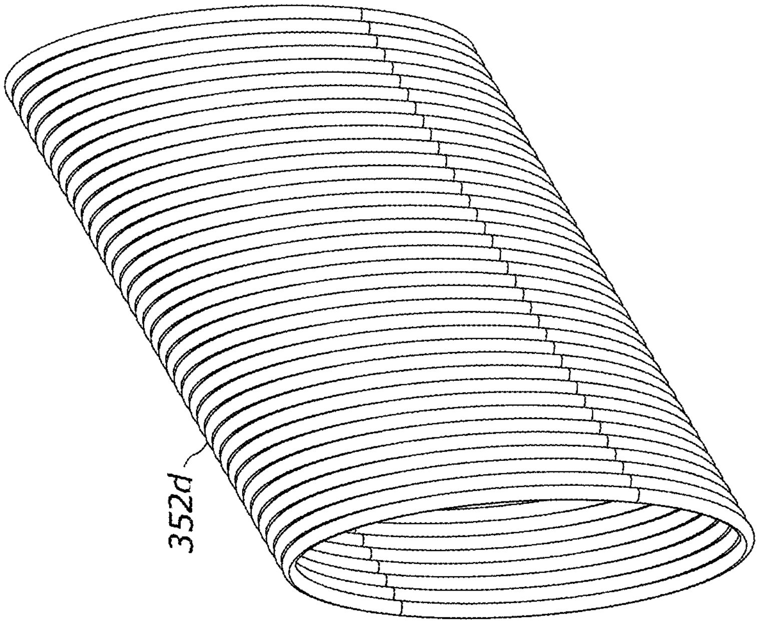
FIGS. 3J-3M are each representative of individual coil layers of the example outer double-helix coil of FIG. 3I, and in accordance with some embodiments.
Figure 3J:
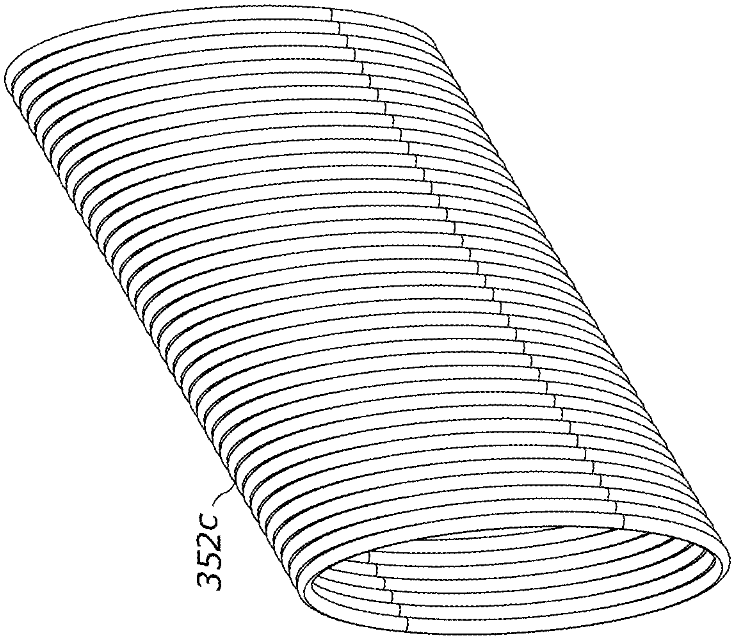
Figure 3M:
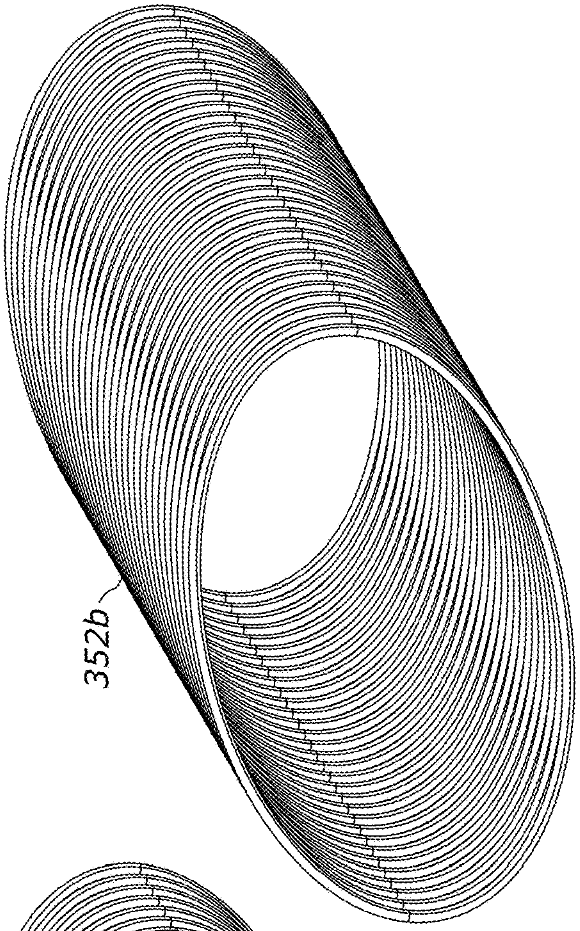
Figure 3L:
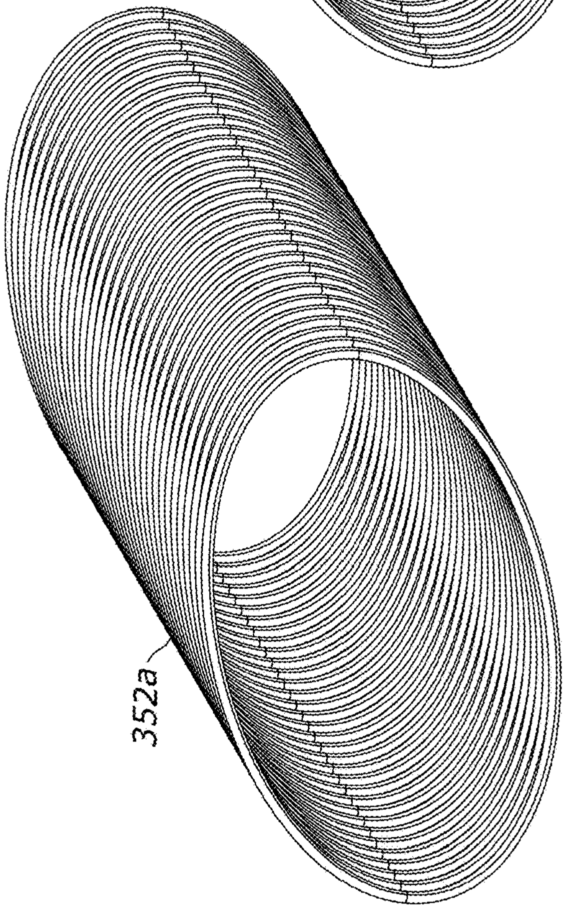

FIGS. 3J-3M are each representative of individual coil layers of the example outer double-helix coil 352 of FIG. 3I, and in accordance with some embodiments. In particular, the third coil layer 352*c* is illustrated in FIG. 3J, the fourth coil layer 352*d* is illustrated in FIG. 3K, the first coil layer 352*a* is illustrated in FIG. 3L, and the second coil layer 352*b* is illustrated in FIG. 3M. As previously mentioned, each of these coil layers 352*a-d* may be concentrically configured, such that the first coil layer 352*a* completely encompasses the second coil layer 352*b*. Moreover, the third coil layer 352*c* may completely encompass the fourth coil layer 352*d*, and both the first coil layer 352*a* and the second coil layer 352*b* may completely encompass the third coil layer 352*c* and the fourth coil layer 352*d*.

Figure 3N:
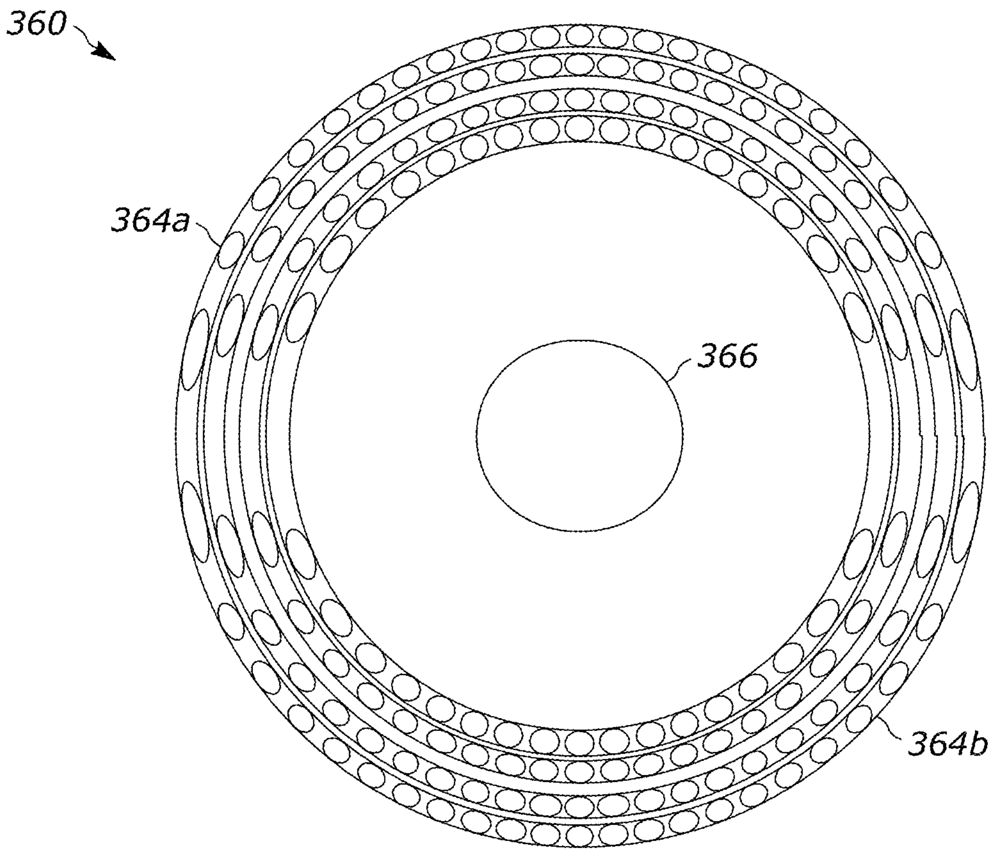
FIG. 3N is a cross-sectional view of the example outer double-helix coil of FIG. 3E, in accordance with some embodiments.

FIG. 3N is a cross-sectional view 360 of the example outer double-helix coil 352 of FIG. 3I, in accordance with some embodiments. The cross-sectional view 360 generally represents the configuration of the example outer double-helix coil 352 as viewed along the Z axis 354*c* of FIG. 3I.

As illustrated in FIG. 3N, the cross-sectional view 360 includes 4 layers of coil indications 364*a*, 364*b*, that are representative of the coil layers 352*a-d* of the example outer double-helix coil 352. In certain instances, the respective layers of the coil indications 364*a*, 364*b* may not correlate directly to the coil layers 352*a-d*. For example, the first coil indication 364*a* may be representative of a portion of any of the first coil layer 352*a*, the second coil layer 352*b*, the third coil layer 352*c*, or the fourth coil layer 352*d*. Similarly, the second coil indication 364*b* may be representative of a portion of any of the first coil layer 352*a*, the second coil layer 352*b*, the third coil layer 352*c*, or the fourth coil layer 352*d*.

Moreover, the cross-sectional view 360 indicates the overall symmetry of the outer double-helix coil 352, resulting in symmetric magnetic fields for scanning an ion beam, and that the central aperture 366 remains unobscured by the coil 352. As illustrated in FIG. 3N, the central aperture 366 may be a circle with a diameter of approximately 6 centimeters, and in certain instances, the central aperture 366 may be the central aperture 305.

Figure 3O:
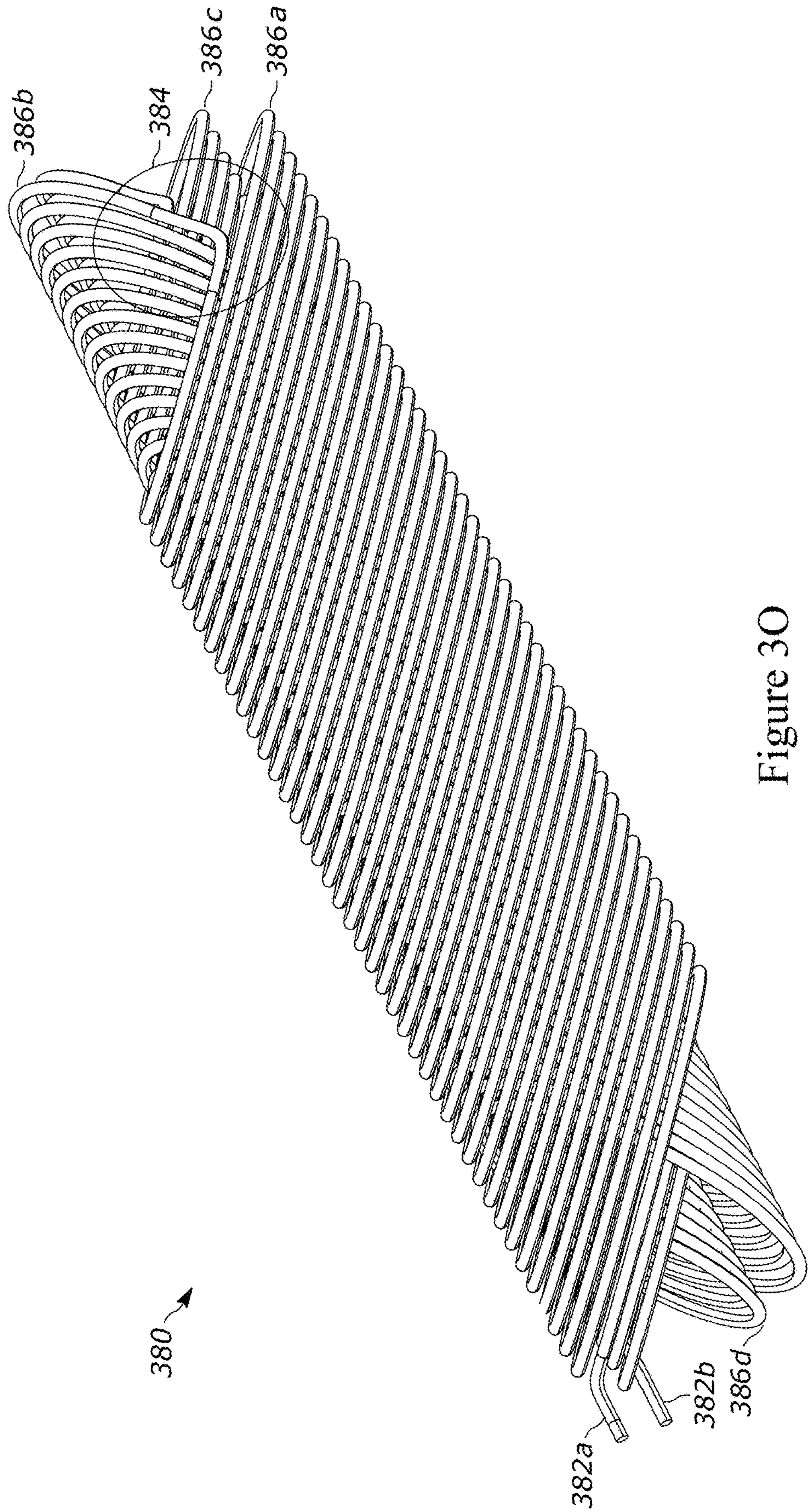
FIG. 3O is a representative perspective view of an inner double-helix coil that includes input/output electrical current leads and transition points between alternating coil layers, in accordance with some embodiments.

FIG. 3O is a representative perspective view of an inner double-helix coil 380 that includes input/output electrical current leads 382*a*, 382*b* and an example transition point 384 between alternating coil layers, in accordance with some embodiments. In particular, the inner double-helix coil 380 includes an input electrical current lead 382*a* where electrical current may be supplied to the inner double-helix coil 380. The electrical current supplied to the inner double-helix coil 380 may flow through the coil 380 in a first direction until it reaches the example transition point 384, where the current transitions from flowing through a first coil layer 386*a* to a second coil layer 386*b*. When the input electrical current reaches the example transition point 384, the current may begin flowing in a second direction that is different (e.g., antiparallel) from the first direction along the length of the second coil layer 386*b*.

Such a transition from one coil layer (e.g., first coil layer 386*a*) to another coil layer (e.g., second coil layer 386*b*) may occur between respective pairs of the coil layers of the inner double-helix coil 380 to enable the input electrical current to flow through each of the individual coil layers. For example, as the input electrical current reaches the end of the second coil layer 386*b*, the input electrical current may reach a subsequent transition point (not shown) that is similar to the example transition point 384, where the input electrical current may transition from flowing through the second coil layer 386*b* to a third coil layer 386*c*. When the input electrical current reaches the subsequent transition point, the current may begin flowing in the first direction that is different (e.g., antiparallel) from the second direction along the length of the third coil layer 386*c*. As the input electrical current reaches the end of the third coil layer 386*c*, the input electrical current may reach another subsequent transition point (not shown) that is similar to the example transition point 384, where the input electrical current may transition from flowing through the third coil layer 386*c* to a fourth coil layer 386*d*. When the input electrical current reaches the another subsequent transition point, the current may begin flowing in the second direction that is different (e.g., antiparallel) from the first direction along the length of the fourth coil layer 386*d*.

Continuing this example, when the input electrical current reaches the end of the fourth coil layer 386*d*, the input electrical current may have traveled through each of the coil layers of the inner double-helix coil 380. As such, the end of the fourth coil layer 386*d* may be the output electrical current lead 382*b*, which enables the input electrical current to leave the inner double-helix coil 380. In this manner, the input electrical current may seamlessly flow through each coil layer 386*a-d* of the inner double helix coil 380 by transitioning between coil layers 386*a-d* and alternately flowing in the first direction and the second direction that is different (e.g., antiparallel) from the first direction.

In some aspects, the 2D scanning magnet (e.g., 2D scanning magnet 300) may also include an iron yoke that encompasses the magnet 300, and the iron yoke may serve to enhance the resulting magnetic field of the 2D scanning magnet. As an example, FIG. 3P is a profile cross-sectional view of an example 2D scanning magnet 388 that includes an iron yoke 390 disposed around the outer double-helix coil 392*a* and the inner double-helix coil 392*b*, in accordance with some embodiments.

The iron yoke 390 may be disposed around the outer double-helix coil 392 and oriented along the same axis as the outer double-helix coil 392*a* in order to enhance the resulting magnetic field generated by the coils 392*a*, 392*b*. In particular, the iron yoke 390 may serve to enhance the resulting magnetic fields by approximately 25% for the inner double-helix coil 392*b* and up to 50% or higher for the outer double-helix coil 392*a*. Additionally, the iron yoke 390 may also reduce negative field tails in the longitudinal magnetic field of the outer double-helix coil 392*a* and the inner double-helix coil 392*b*. Moreover, the example 2D scanning magnet 388 may include a hollow tube 394 placed within the inner double-helix coil 392*b*. The hollow tube 394 (e.g., similar to the hollow tube 318) may have thin walls sufficient to allow a carbon ion beam (e.g., carbon ion beam 122) to pass through a central aperture (e.g., central aperture 305) of the 2D scanning magnet 388.

Figure 3P:
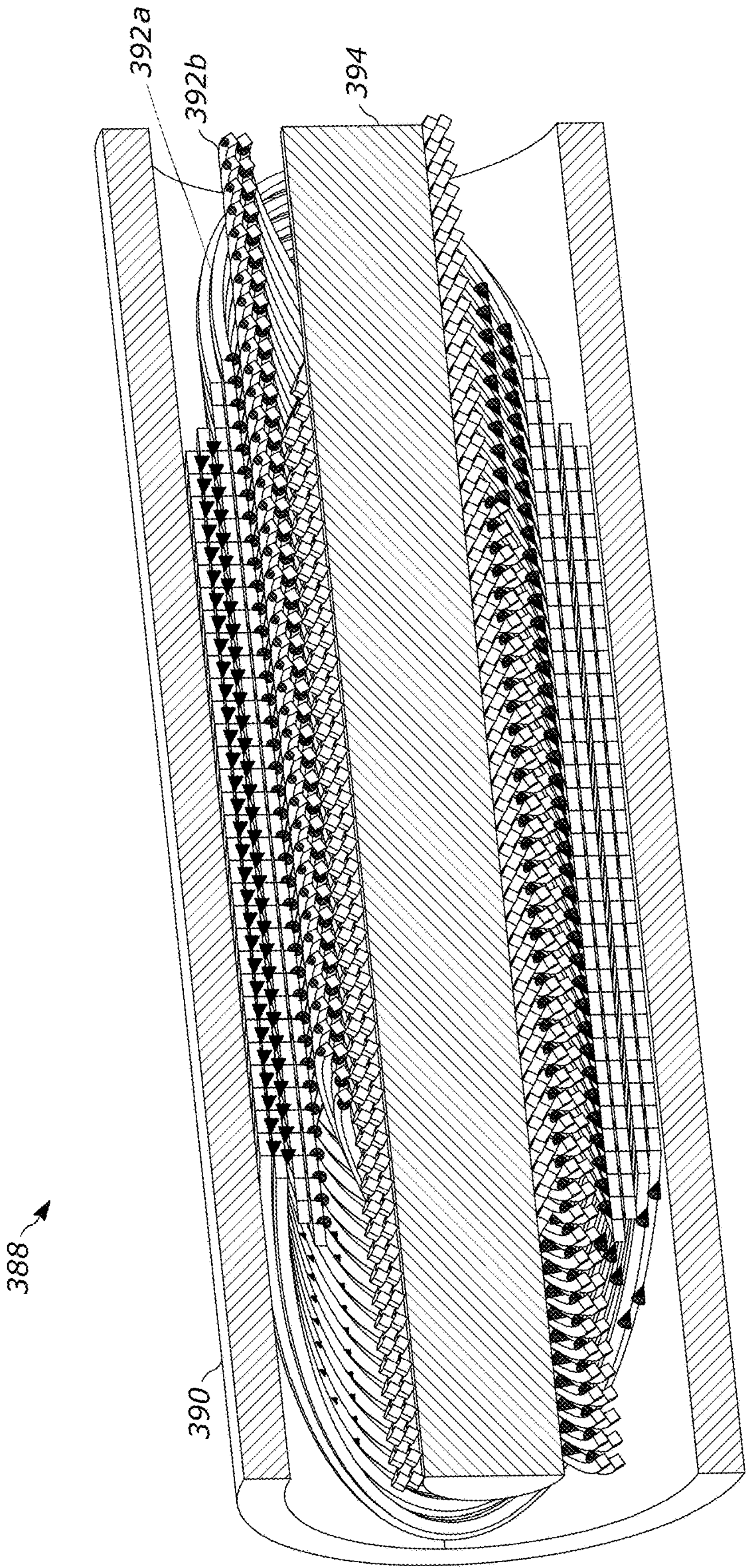
FIG. 3P is a profile cross-sectional view of an example 2D scanning magnet that includes an iron yoke disposed around the outer double-helix coil, in accordance with some embodiments.
Figure 3Q:
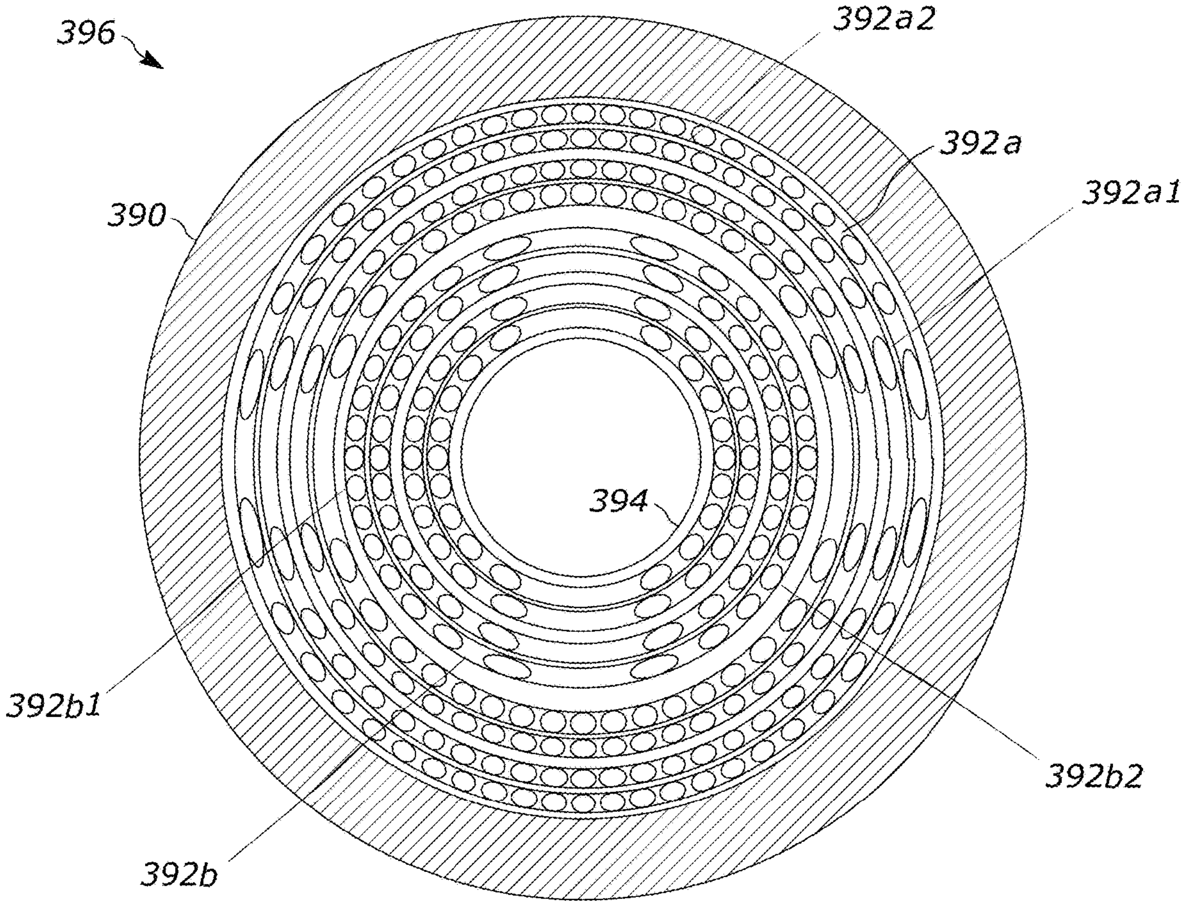
FIG. 3Q is a cross-sectional view of the example 2D scanning magnet of FIG. 3P, in accordance with some embodiments.

FIG. 3Q is a cross-sectional view 396 of the example 2D scanning magnet 388 of FIG. 3P, in accordance with some embodiments. The cross-sectional view 396 generally represents the configuration of the example 2D scanning magnet 388 as viewed at a point longitudinally through the 2D scanning magnet 388.

As illustrated in FIG. 3Q, the cross-sectional view 396 includes 8 layers of coil indications 392*a*1, 392*a*2, 392*b*1, 392*b*2, that are representative of the 4 coil layers of the outer double-helix coil 392*a* and the 4 coil layers of the inner double-helix coil 392*b*. In certain instances, the respective layers of the coil indications 392*a*1, 392*a*2, 392*b*1, 392*b*2 may not correlate directly to the coil layers of the outer double-helix coil 392*a* and/or the inner double-helix coil 392*b*. For example, the first coil indication 392*a*1 may be representative of a portion of any of the coil layers comprising the outer double-helix coil 392*a*. Similarly, the second coil indication 392*a*2 may be representative of a portion of any of the coil layers of the outer double-helix coil 392*a*. Further, the third coil indication 392*b*1 may be representative of a portion of any of the coil layers comprising the inner double-helix coil 392*b*. Similarly, the fourth coil indication 392*b*2 may be representative of a portion of any of the coil layers of the inner double-helix coil 392*b*.

Moreover, the cross-sectional view 396 indicates the overall symmetry of the example 2D scanning magnet 388, resulting in symmetric magnetic fields for scanning an ion beam, and that the hollow tube 394 provides sufficient space within the central aperture (e.g., central aperture 305) to keep the central aperture unobscured by the double-helix coils 392*a*, 392*b*.

With continued reference to FIG. 3A, the coil lengths and other physical features of the coils of the 2D scanning magnet 300 also provide advantageous results that balance magnetic field uniformity and field strength. For example, the outer double-helix coil length may be increased, and as a result, the longitudinal magnetic field of the 2D scanning magnet 300 may be more symmetric. As another example, the 2D scanning magnet 300 may be made with square copper wire that is approximately 5 millimeters by 5 millimeters in dimension, whereas some conventional systems (e.g., conventional double helix, single plane magnets) may utilize thinner wires that are, for example, 1.5 millimeters square. Such thick square copper wires utilized for the 2D scanning magnet 300 coils may be chosen in order to reduce the overall current density through the 2D scanning magnet 300 and current losses if direct current is used to drive the 2D scanning magnet 300. In some aspects, the coil wires may be round and/or any other suitable geometry, and the coil wires may be 4-6 millimeters square, 4-6 millimeters in diameter, and/or any other suitable dimension.

Moreover, in certain instances, the copper wire chosen to construct the 2D scanning magnet 300 may also include cooling wire holes drilled through the center of the 5 millimeter square wire to enable more efficient cooling of the 2D scanning magnet during operation. These wire holes may be, for example, 3 millimeter circular wire holes located in the center of the coil wires allowing water to pass through the holes thereby cooling the 2D scanning magnet 300. As a result, the wire holes may enable the 2D scanning magnet 300 to operate consistently for multiple minutes (e.g., 3 minutes or longer, as required to treat a patient) without requiring additional cooling. When an individual patient's scanning procedure is complete, the 2D scanning magnet 300 may stop operation (e.g., turn-off, reset) prior to resuming operation to treat a subsequent patient. In this manner, the 3 millimeter wire holes may increase the reliability of the 2D scanning magnet 300 by lengthening the effective operating time of the magnet 300. Of course, it should be understood that any suitable cooling mechanism may be utilized, such as air cooling, in order to regulate the operating temperature of the 2D scanning magnet 300. Moreover, as previously mentioned, the wires may be round and/or any other suitable geometry, such that the wire holes are drilled through the round wire and/or the wire of any suitable geometry.

The outer double-helix coil and the inner double-helix coil may also have different field variation rates, representative of the variation frequency of the magnetic fields generated by the respective coils. As a result, one double-helix coil may be designated as a relatively "fast" magnet, and the other double-helix coil may be designated as a relatively "slow" magnet based on their respective field variation rates. For example, in the 2D scanning magnet 300, the inner double-helix coil may be a fast magnet and the outer double-helix coil may be a slow magnet. This designation may be made for the respective coils in order to minimize the negative effects of eddy currents in the 2D scanning magnet 300. If the inner double-helix coil is designated as the fast magnet, then eddy losses in the outer double-helix coil (the "slow" magnet) resulting from the fast-varying field of the fast magnet may be minimized. Of course, it should be understood that, in certain instances, both magnets may have identical field variation rates, such that neither magnet is the relatively "fast" or the relatively "slow" magnet.

Figure 4A:
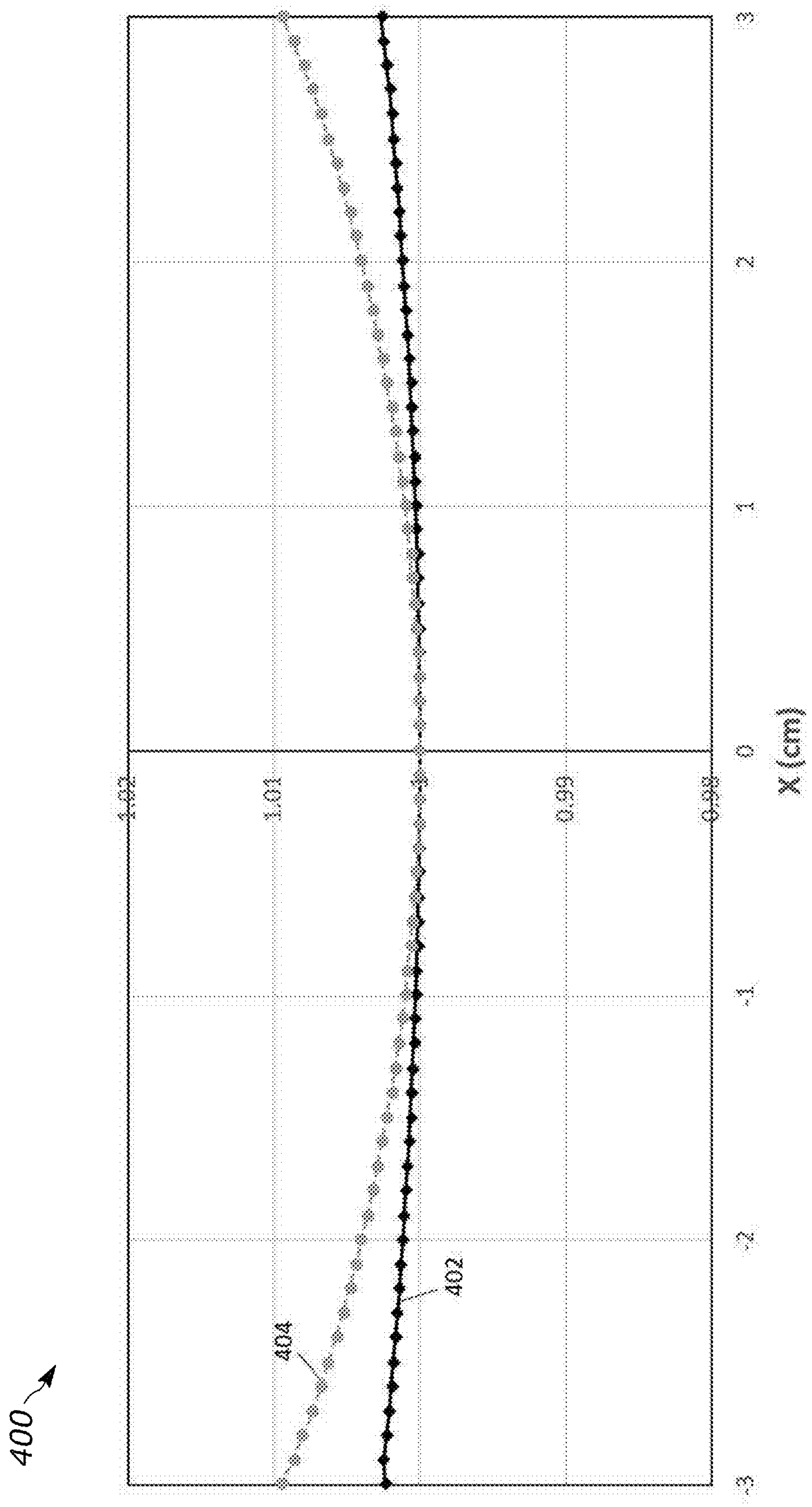
FIG. 4A is an example graph illustrating horizontal magnetic field profiles across a horizontal scanning plane and a vertical scanning plane generated by the example 2D scanning magnet of FIG. 3A, in accordance with some embodiments.

As a result of these design features of the 2D scanning magnet 300 illustrated in FIGS. 3A and 3B, the 2D scanning magnets of the present disclosure overcome the issues experienced by conventional scanning magnets (e.g., prior art scanning magnet 200). Specifically, as a consequence of the designs of the outer double-helix coil (e.g., first outer coil 302*a* and second outer coil 302*b*) and the inner double-helix coil (e.g., first inner coil 304*a* and second inner coil 304*b*), the magnetic fields generated by both coils are uniform in both directions in which the ion beam is scanned by the 2D scanning magnet 300. To illustrate this uniformity, FIG. 4A provides a graph 400 illustrating horizontal magnetic field profiles across a horizontal scanning plane and a vertical scanning plane generated by the example 2D scanning magnet 300 of FIG. 3A, in accordance with some embodiments. The graph 400 may show a measure of uniformity corresponding to the respective horizontal magnetic field components of the double-helix coils of the 2D scanning magnet 300 plotted as a function of the lateral/vertical position within the central aperture 305 of the 2D scanning magnet 300. The central aperture 305 may generally have a diameter of approximately 6 centimeters, such that the lateral/vertical center of the central aperture 305 is designated by 0 on the x-axis, and the +/−3 centimeter values on the x-axis may approximately represent the lateral/vertical extremities of the central aperture 305.

As illustrated in FIG. 4A, both the outer double-helix coil and the inner double-helix coil of the 2D scanning magnet 300 generate a magnetic field that has components in the horizontal direction (e.g., a lateral direction) relative to the propagation direction of the ion beam. The uniformity of the horizontal magnetic field components generated by the 2D scanning magnet 300 across the horizontal scanning plane may be represented by the first horizontal field plot line 402, and the uniformity of the horizontal magnetic field components generated by the 2D scanning magnet 300 across the vertical scanning plane may be represented by the second horizontal field plot line 404. The graph 400 shows that the magnetic field is relatively uniform in the horizontal direction, such that the horizontal components of the magnetic fields generated by both coils are generally within 1% of complete uniformity throughout the lateral/vertical width of the central aperture 305 of the 2D scanning magnet 300.

Figure 4B:
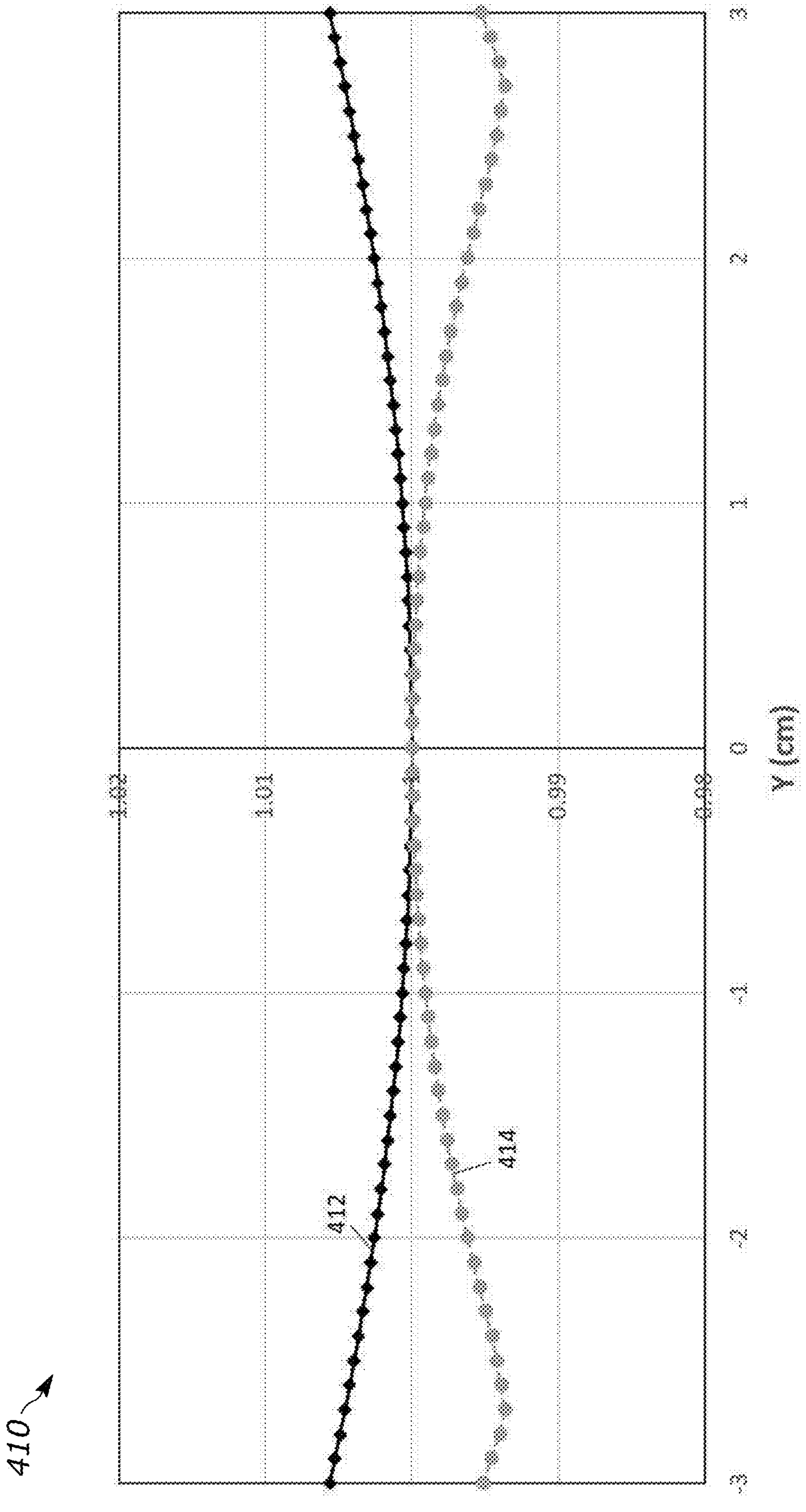
FIG. 4B is an example graph illustrating vertical magnetic field profiles across a horizontal scanning plane and a vertical scanning plane generated by the example 2D scanning magnet of FIG. 3A, in accordance with some embodiments.

Similarly, both double-helix coils achieve high levels of uniformity in the vertical magnetic field components. To illustrate this uniformity, FIG. 4B provides a graph 410 illustrating vertical magnetic field profiles across a horizontal scanning plane and a vertical scanning plane generated by the example 2D scanning magnet 300 of FIG. 3A, in accordance with some embodiments. The graph 410 may show a measure of uniformity corresponding to the respective vertical magnetic field components of the double-helix coils of the 2D scanning magnet 300 plotted as a function of the lateral/vertical position within the central aperture 305 of the 2D scanning magnet 300. As previously mentioned, the central aperture 305 may generally have a diameter of approximately 6 centimeters, and as a result, the lateral/vertical center of the central aperture 305 is designated by 0 on the x-axis, and the +/−3 centimeter values on the x-axis may approximately represent the lateral/vertical extremities of the central aperture 305.

As illustrated in FIG. 4B, both the outer double-helix coil and the inner double-helix coil of the 2D scanning magnet 300 generate a magnetic field that has components in the vertical direction relative to the propagation direction of the ion beam. The uniformity of the vertical magnetic field components generated by the 2D scanning magnet 300 across the horizontal scanning plane may be represented by the first vertical field plot line 412, and the uniformity of the vertical magnetic field components generated by the 2D scanning magnet 300 across the vertical scanning plane may be represented by the second vertical field plot line 414. The graph 410 shows that the magnetic field is relatively uniform in the vertical direction, such that the vertical components of the magnetic fields generated by both coils are generally within 1% of complete uniformity throughout the lateral/vertical width of the central aperture 305 of the 2D scanning magnet 300.

Accordingly, this uniformity in both scanning directions (e.g., horizontal and vertical relative to the propagation direction of the ion beam) may result in fewer inadvertent adjustments to the scanning of the ion beam, which in turn, may result in far less inadvertent damage to healthy tissue surrounding a target volume (e.g., target volume 108). Thus, the design illustrated and described herein in reference to FIGS. 3A-4B improve over conventional scanning magnet designs (e.g. prior art scanning magnet 200) by significantly minimizing the non-uniformity in ion beam scanning directions.

Figure 5:
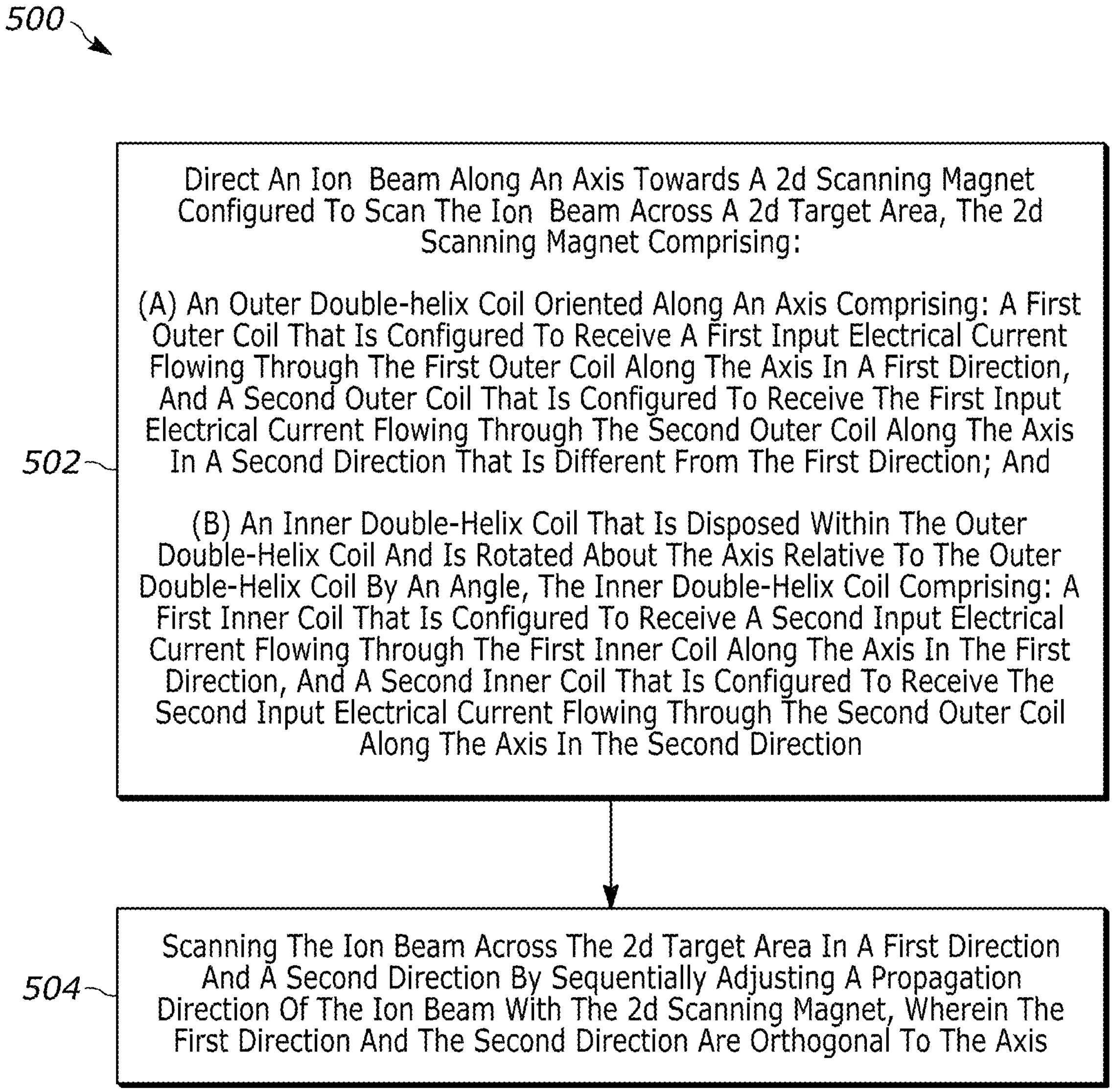
FIG. 5 is a flow diagram of an example method for scanning ion beams with a two-dimensional (2D) scanning magnet configured in accordance with the techniques of the present disclosure.

FIG. 5 is a flow diagram of an example method 500 for scanning ion beams. At block 502, the method 500 includes directing an ion beam along an axis towards a 2D scanning magnet configured to scan the ion beam across a 2D target area. The 2D scanning magnet may include: an outer double-helix coil oriented along an axis and an inner double-helix coil that is disposed within the outer double-helix coil and is rotated about the axis relative to the outer double-helix coil by an angle. In certain instances, the outer double-helix coil and the inner double-helix coil are configured to generate a magnetic field between 0.1 and 1.5 Tesla.

The outer double-helix coil may include: a first outer coil that is configured to receive a first input electrical current flowing through the first outer coil along the axis in a first direction, and a second outer coil that is configured to receive the first input electrical current flowing through the second outer coil along the axis in a second direction that is different from the first direction. In some instances, the outer double-helix coil is between 50 centimeters and 80 centimeters in length.

The inner double-helix coil may include: a first inner coil that is configured to receive a second input electrical current flowing through the first inner coil along the axis in the first direction, and a second inner coil that is configured to receive the second input electrical current flowing through the second inner coil along the axis in the second direction. In some instances, the inner double-helix coil is between 40 cm and 70 cm in length. Moreover, in certain instances, the outer-double helix coil and the inner double-helix coil have between 4 coil layers and 6 coil layers, and are comprised of copper wire. In some instances, the outer double-helix coil and the inner double-helix coil are comprised of a square wire that has dimensions between 4 millimeters by 4 millimeters and 6 millimeters by 6 millimeters.

Additionally, in certain instances, the axis is a first axis, and the outer double-helix coil and the inner double-helix coil have a tilt angle with an absolute value between 45 degrees and 75 degrees relative to a respective second axis that is orthogonal to the first axis. For example, for the inner double-helix coil, the first axis may be the Z axis 306*c* and the respective second axis may be the Y axis 306*b* of FIG. 3A. In this example, the first inner coil 304*a* may be rotated around the Y axis 306*b* by a tilt angle of between 45 degrees and 75 degrees relative to the Y axis 306*b*, and the second inner coil 304*b* may be rotated around the Y axis 306*b* by a tilt angle of between 45 degrees and 75 degrees in an opposite direction to the first inner coil 304*a*. Thus, the tilt angle of the first inner coil 304*a* may be −75 degrees to −45 degrees relative to the Y axis 306*b* and the tilt angle of the second inner coil 304*b* may be 45 degrees to 75 degrees relative to the Y axis 306*b*.

In another example, for the outer double-helix coil, the first axis may be the Z axis 306*c* and the respective second axis may be the X axis 306*a* of FIG. 3A. In this example, the first outer coil 302*a* may be rotated around the X axis 306*a* by a tilt angle with an absolute value between 45 degrees and 75 degrees relative to the X axis 306*a*, and the second outer coil 302*b* may be rotated around the X axis 306*a* by a tilt angle with an absolute value between 45 degrees and 75 degrees in an opposite direction to the first outer coil 302*a*. Thus, the tilt angle of the first outer coil 302*a* may be 45 degrees to 75 degrees relative to the X axis 306*a* and the tilt angle of the second outer coil 302*b* may be −75 degrees to −45 degrees relative to the X axis 306*a*.

Further, in certain instances, the outer double-helix coil has between 150 and 270 coil turns and the inner double-helix coil has between 100 and 250 coil turns. In some instances, the outer double-helix coil and the inner double-helix coil have a turn spacing between 0.25 millimeters and 0.55 millimeters. Additionally, in certain instances, the outer double-helix coil and the inner double-helix coil include wire holes between 2 millimeters and 3 millimeters in diameter.

At block 504, the method 500 may also include scanning the ion beam across the 2D target area in a first direction and a second direction by sequentially adjusting a propagation direction of the ion beam with the 2D scanning magnet, wherein the first direction and the second direction are orthogonal to the axis.

ASPECTS

The following list of aspects reflects a variety of the embodiments explicitly contemplated by the present application. Those of ordinary skill in the art will readily appreciate that the aspects below are neither limiting of the embodiments disclosed herein, nor exhaustive of all the embodiments conceivable from the disclosure above, but are instead meant to be exemplary in nature.

Aspect 1. A compact two-dimensional (2D) scanning magnet for scanning ion beams, the compact 2D scanning magnet comprising: an outer double-helix coil oriented along an axis comprising: a first outer coil that is configured to receive a first input electrical current flowing through the first outer coil in a first direction, and a second outer coil that is configured to receive the first input electrical current flowing through the second outer coil in a second direction that is different from the first direction; and an inner double-helix coil that is disposed within the outer double-helix coil and is rotated about the axis relative to the outer double-helix coil by an angle, the inner double-helix coil comprising: a first inner coil that is configured to receive a second input electrical current flowing through the first inner coil in the first direction, and a second inner coil that is configured to receive the second input electrical current flowing through the second inner coil in the second direction, wherein the outer double-helix coil and the inner double-helix coil are configured to scan an input ion beam across a 2D target area.

Aspect 2. The compact 2D scanning magnet of aspect 1, wherein the outer double-helix coil is between 50 centimeters and 80 centimeters in length, and the inner double-helix coil is between 40 cm and 70 cm in length.

Aspect 3. The compact 2D scanning magnet of any one of aspects 1-2, wherein the outer-double helix coil and the inner double-helix coil have between 4 coil layers and 6 coil layers.

Aspect 4. The compact 2D scanning magnet of any one of aspects 1-3, wherein the outer double-helix coil and the inner double-helix coil are comprised of copper wire.

Aspect 5. The compact 2D scanning magnet of any one of aspects 1-4, wherein the outer double-helix coil and the inner double-helix coil are comprised of a square wire that has dimensions between 4 millimeters by 4 millimeters and 6 millimeters by 6 millimeters.

Aspect 6. The compact 2D scanning magnet of any one of aspects 1-5, wherein the axis is a first axis, and the outer double-helix coil and the inner double-helix coil are rotated by a tilt angle with an absolute value between 45 degrees and 75 degrees relative to a respective second axis that is orthogonal to the first axis.

Aspect 7. The compact 2D scanning magnet of any one of aspects 1-6, wherein the outer double-helix coil has between 150 and 270 coil turns and the inner double-helix coil has between 100 and 250 coil turns.

Aspect 8. The compact 2D scanning magnet of any one of aspects 1-7, wherein the outer double-helix coil and the inner double-helix coil have a turn spacing between 0.25 millimeters and 0.55 millimeters.

Aspect 9. The compact 2D scanning magnet of any one of aspects 1-8, further comprising an iron yoke disposed around the outer double-helix coil and oriented along the axis.

Aspect 10. The compact 2D scanning magnet of any one of aspects 1-9, wherein the outer double-helix coil and the inner double-helix coil include wire holes between 2 millimeters and 3 millimeters in diameter.

Aspect 11. A system for scanning ion beams, the system comprising: an accelerator for accelerating an ion beam towards a two-dimensional (2D) target area; and a 2D scanning magnet configured to scan the ion beam across the 2D target area, the 2D scanning magnet comprising: an outer double-helix coil oriented along an axis comprising: a first outer coil that is configured to receive a first input electrical current flowing through the first outer coil along the axis in a first direction, and a second outer coil that is configured to receive the first input electrical current flowing through the second outer coil along the axis in a second direction that is different from the first direction, and an inner double-helix coil that is disposed within the outer double-helix coil and is rotated about the axis relative to the outer double-helix coil by an angle, the inner double-helix coil comprising: a first inner coil that is configured to receive a second input electrical current flowing through the first inner coil along the axis in the first direction, and a second inner coil that is configured to receive the second input electrical current flowing through the second inner coil along the axis in the second direction.

Aspect 12. The system of aspect 11 wherein the outer double-helix coil is between 50 centimeters and 80 centimeters in length, and the inner double-helix coil is between 40 cm and 70 cm in length.

Aspect 13. The system of any one of aspects 11-12, wherein the outer-double helix coil and the inner double-helix coil have between 4 coil layers and 6 coil layers.

Aspect 14. The system of any one of aspects 11-13, wherein the outer double-helix coil and the inner double-helix coil are comprised of copper wire.

Aspect 15. The system of any one of aspects 11-14, wherein the outer double-helix coil and the inner double-helix coil are comprised of a square wire that has dimensions between 4 millimeters by 4 millimeters and 6 millimeters by 6 millimeters.

Aspect 16. The system of any one of aspects 11-15, wherein the axis is a first axis, and the outer double-helix coil and the inner double-helix coil are rotated by a tilt angle with an absolute value between 45 degrees and 75 degrees relative to a respective second axis that is orthogonal to the first axis.

Aspect 17. The system of any one of aspects 11-16, wherein the outer double-helix coil has between 150 and 270 coil turns, the inner double-helix coil has between 100 and 250 coil turns, and the outer double-helix coil and the inner double-helix coil have a turn spacing between 0.25 millimeters and 0.55 millimeters.

Aspect 18. The system of any one of aspects 11-17, wherein the outer double-helix coil and the inner double-helix coil are configured to generate a magnetic field between 0.1 and 1.5 Tesla.

Aspect 19. The system of any one of aspects 11-18, wherein the outer double-helix coil and the inner double-helix coil include wire holes between 2 millimeters and 3 millimeters in diameter.

Aspect 20. A method for scanning ion beams, the method comprising: directing an ion beam along an axis towards a 2D scanning magnet configured to scan the ion beam across a 2D target area, the 2D scanning magnet comprising: an outer double-helix coil oriented along an axis comprising: a first outer coil that is configured to receive a first input electrical current flowing through the first outer coil along the axis in a first direction, and a second outer coil that is configured to receive the first input electrical current flowing through the second outer coil along the axis in a second direction that is different from the first direction, and an inner double-helix coil that is disposed within the outer double-helix coil and is rotated about the axis relative to the outer double-helix coil by an angle, the inner double-helix coil comprising: a first inner coil that is configured to receive a second input electrical current flowing through the first inner coil along the axis in the first direction, and a second inner coil that is configured to receive the second input electrical current flowing through the second inner coil along the axis in the second direction; and scanning the ion beam across the 2D target area in a first direction and a second direction by sequentially adjusting a propagation direction of the ion beam with the 2D scanning magnet, wherein the first direction and the second direction are orthogonal to the axis.

ADDITIONAL CONSIDERATIONS

The following additional considerations apply to the foregoing discussion. Throughout this specification, plural instances may implement functions, components, operations, or structures described as a single instance. Although individual functions and instructions of one or more methods are illustrated and described as separate operations, one or more of the individual operations may be performed concurrently, and nothing requires that the operations be performed in the order illustrated. Structures and functionality presented as separate components in exemplary configurations may be implemented as a combined structure or component. Similarly, structures and functionality presented as a single component may be implemented as separate components. These and other variations, modifications, additions, and improvements fall within the scope of the subject matter herein.

As used herein any reference to "some embodiments" or "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a function, process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the description. This description should be read to include one or at least one and the singular also includes the plural unless it is obvious that it is meant otherwise.

Still further, the figures depict preferred embodiments of a system 100 for purposes of illustration only. One of ordinary skill in the art will readily recognize from the following discussion that alternative embodiments of the structures and methods illustrated herein may be employed without departing from the principles described herein.

Upon reading this disclosure, those of skill in the art will appreciate still additional alternative structural and functional designs for methods and systems for scanning ion beams through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A compact two-dimensional (2D) scanning magnet for scanning ion beams, the compact 2D scanning magnet comprising:

an outer double-helix coil oriented along an axis comprising:

a first outer coil that is configured to receive a first input electrical current flowing through the first outer coil in a first direction, and a second outer coil that is configured to receive the first input electrical current flowing through the second outer coil in a second direction that is different from the first direction; and an inner double-helix coil that is disposed within the outer double-helix coil and is rotated about the axis relative to the outer double-helix coil by an angle, the inner double-helix coil comprising:

a first inner coil that is configured to receive a second input electrical current flowing through the first inner coil in the first direction, and a second inner coil that is configured to receive the second input electrical current flowing through the second inner coil in the second direction, wherein the outer double-helix coil and the inner double-helix coil are configured to scan an input ion beam across a 2D target area.

2. The compact 2D scanning magnet of claim 1, wherein the outer double-helix coil is between 50 centimeters and 80 centimeters in length, and the inner double-helix coil is between 40 cm and 70 cm in length.

3. The compact 2D scanning magnet of claim 1, wherein the outer-double helix coil and the inner double-helix coil have between 4 coil layers and 6 coil layers.

4. The compact 2D scanning magnet of claim 1, wherein the outer double-helix coil and the inner double-helix coil are comprised of copper wire.

5. The compact 2D scanning magnet of claim 1, wherein the outer double-helix coil and the inner double-helix coil are comprised of a square wire that has dimensions between 4 millimeters by 4 millimeters and 6 millimeters by 6 millimeters.

6. The compact 2D scanning magnet of claim 1, wherein the axis is a first axis, and the outer double-helix coil and the inner double-helix coil are rotated by a tilt angle with an absolute value between 45 degrees and 75 degrees relative to a respective second axis that is orthogonal to the first axis.

7. The compact 2D scanning magnet of claim 1, wherein the outer double-helix coil has between 150 and 270 coil turns and the inner double-helix coil has between 100 and 250 coil turns.

8. The compact 2D scanning magnet of claim 1, wherein the outer double-helix coil and the inner double-helix coil have a turn spacing between 0.25 millimeters and 0.55 millimeters.

9. The compact 2D scanning magnet of claim 1, further comprising:

an iron yoke disposed around the outer double-helix coil and oriented along the axis.

10. The compact 2D scanning magnet of claim 1, wherein the outer double-helix coil and the inner double-helix coil include wire holes between 2 millimeters and 3 millimeters in diameter.

11. A system for scanning ion beams, the system comprising:

an accelerator for accelerating an ion beam towards a two-dimensional (2D) target area; and a 2D scanning magnet configured to scan the ion beam across the 2D target area, the 2D scanning magnet comprising:

an outer double-helix coil oriented along an axis comprising:

a first outer coil that is configured to receive a first input electrical current flowing through the first outer coil along the axis in a first direction, and a second outer coil that is configured to receive the first input electrical current flowing through the second outer coil along the axis in a second direction that is different from the first direction, and an inner double-helix coil that is disposed within the outer double-helix coil and is rotated about the axis relative to the outer double-helix coil by an angle, the inner double-helix coil comprising:

a first inner coil that is configured to receive a second input electrical current flowing through the first inner coil along the axis in the first direction, and a second inner coil that is configured to receive the second input electrical current flowing through the second inner coil along the axis in the second direction.

12. The system of claim 11 wherein the outer double-helix coil is between 50 centimeters and 80 centimeters in length, and the inner double-helix coil is between 40 cm and 70 cm in length.

13. The system of claim 11, wherein the outer-double helix coil and the inner double-helix coil have between 4 coil layers and 6 coil layers.

14. The system of claim 11, wherein the outer double-helix coil and the inner double-helix coil are comprised of copper wire.

15. The system of claim 11, wherein the outer double-helix coil and the inner double-helix coil are comprised of a square wire that has dimensions between 4 millimeters by 4 millimeters and 6 millimeters by 6 millimeters.

16. The system of claim 11, wherein the axis is a first axis, and the outer double-helix coil and the inner double-helix coil are rotated by a tilt angle with an absolute value between 45 degrees and 75 degrees relative to a respective second axis that is orthogonal to the first axis.

17. The system of claim 11, wherein the outer double-helix coil has between 150 and 270 coil turns, the inner double-helix coil has between 100 and 250 coil turns, and the outer double-helix coil and the inner double-helix coil have a turn spacing between 0.25 millimeters and 0.55 millimeters.

18. The system of claim 11, wherein the outer double-helix coil and the inner double-helix coil are configured to generate a magnetic field between 0.1 and 1.5 Tesla.

19. The system of claim 11, wherein the outer double-helix coil and the inner double-helix coil include wire holes between 2 millimeters and 3 millimeters in diameter.

20. A method for scanning ion beams, the method comprising:

directing an ion beam along an axis towards a 2D scanning magnet configured to scan the ion beam across a 2D target area, the 2D scanning magnet comprising:

an outer double-helix coil oriented along an axis comprising:

a first outer coil that is configured to receive a first input electrical current flowing through the first outer coil along the axis in a first direction, and a second outer coil that is configured to receive the first input electrical current flowing through the second outer coil along the axis in a second direction that is different from the first direction, and an inner double-helix coil that is disposed within the outer double-helix coil and is rotated about the axis relative to the outer double-helix coil by an angle, the inner double-helix coil comprising:

a first inner coil that is configured to receive a second input electrical current flowing through the first inner coil along the axis in the first direction, and a second inner coil that is configured to receive the second input electrical current flowing through the second inner coil along the axis in the second direction; and scanning the ion beam across the 2D target area in a first direction and a second direction by sequentially adjusting a propagation direction of the ion beam with the 2D scanning magnet, wherein the first direction and the second direction are orthogonal to the axis.

* * * * *